(12) United States Patent
Maeda et al.

(10) Patent No.: US 6,727,572 B2
(45) Date of Patent: Apr. 27, 2004

(54) SEMICONDUCTOR DEVICE INCLUDING HIGH FREQUENCY CIRCUIT WITH INDUCTOR

(75) Inventors: Shigenobu Maeda, Tokyo (JP); Shigeto Maegawa, Tokyo (JP); Takashi Ipposhi, Tokyo (JP); Toshiaki Iwamatsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 45 days.

(21) Appl. No.: 10/340,664

(22) Filed: Jan. 13, 2003

(65) Prior Publication Data

US 2003/0102521 A1 Jun. 5, 2003

Related U.S. Application Data

(62) Division of application No. 10/163,613, filed on Jun. 7, 2002, now Pat. No. 6,541,841, which is a division of application No. 09/717,038, filed on Nov. 22, 2000, now Pat. No. 6,426,543.

(30) Foreign Application Priority Data

Jun. 6, 2000 (JP) ......................... 2000-168925

(51) Int. Cl.[7] .................... H01L 29/00; H01L 29/76; H01L 29/94; H01L 31/062; H01L 31/113
(52) U.S. Cl. ....................... 257/531; 257/379
(58) Field of Search ................ 257/350, 379, 257/531

(56) References Cited

U.S. PATENT DOCUMENTS

| 5,939,753 | A | 8/1999 | Ma et al. |
| 6,236,101 | B1 | 5/2001 | Erdeljac et al. |
| 6,373,121 | B1 * | 4/2002 | Pan ......................... 257/531 |
| 6,410,974 | B2 | 6/2002 | Chu et al. |
| 6,452,249 | B1 | 9/2002 | Maeda et al. |
| 6,611,041 | B2 * | 8/2003 | Maeda et al. ............... 257/531 |

FOREIGN PATENT DOCUMENTS

JP 9-148587 6/1997

OTHER PUBLICATIONS

Y. Hirano, et al. "Bulk–Layout–Compatible 0.18μm SOI–CMOS Technology Using Body–Fixed Partial Trench Isolation (PTI)", 1999 IEEE International SOI Conference, Oct., 1999, pp. 131, 132.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A semiconductor device with a spiral inductor is provided, which determines the area of an insulation layer to be provided in the surface of a wiring board thereunder. A trench isolation oxide film, which is a complete isolation oxide film including in part the structure of a partial isolation oxide film, is provided in a larger area of the surface of an SOI layer than that corresponding to the area of a spiral inductor. The trench isolation oxide film includes a first portion having a first width and extending in a direction approximately perpendicular the surface of a buried oxide film, and a second portion having a second width smaller than the first width and being continuously formed under the first portion, extending approximately perpendicular to the surface of the buried oxide film. The trench isolation oxide film is provided such that a horizontal distance between each end surface of the second portion and a corresponding end surface of the spiral inductor makes a predetermined distance or more.

7 Claims, 28 Drawing Sheets

SEMICONDUCTOR DEVICE INCLUDING HIGH FREQUENCY CIRCUIT WITH INDUCTOR

This application is a divisional of U.S. application Ser. No. 10/163,613, filed Jun. 7, 2002, now U.S. Pat. No. 6,541,841, which is a divisional of U.S. application Ser. No. 09/717,038, filed Nov. 22, 2000, now U.S. Pat. No. 6,426,543.

BACKGROUND OF THE INVENTION

1. Field of the Invention

The present invention relates to a semiconductor device and a method of manufacturing that semiconductor device, and more specifically to a semiconductor device comprising a high frequency circuit with an inductor.

2. Description of the Background Art

One example of the structure of a semiconductor device with a high frequency circuit will be described with reference to FIG. 35. FIG. 35 is a block diagram of the structure of a semiconductor device 90 that has the function of receiving radio signals in the radio-frequency range of 10 kHz to 100 GHz and outputting audio signals.

As shown in FIG. 35, the semiconductor device 90 comprises at least a RF circuit portion 91 for demodulating radio signals received, a logic portion 92 for processing and translating those signals demodulated by the RF circuit portion 91 into audio signals, and a memory cell portion 93 for storing necessary data for signal processing in the RF circuit portion 91 and the logic portion 92. The semiconductor device 90 is connected to an antenna unit 94 for receiving radio signals and a sound output device 95 for outputting audio signals.

So-called high-frequency circuits, including the RF circuit portion 91, comprise an inductor (inductance element) in addition to a resistor and a capacitor. Since the inductor acts to advance the phase of high frequency current, the use of such an inductor against the capacitor which acts to delay the phase of high frequency current, provides matching of the high frequency current.

An inductor L1 in the RF circuit portion 91 illustrated in FIG. 35 has a parasitic capacitor C1 which is grounded through a resistor R1. The resistor R1 is the resistance of a semiconductor substrate on which the RF circuit portion 91 is formed. Very low or high values of such resistance offer no problem, but certain types of substrates have such a resistance (e.g., around 100 Ωcm) that consumes power because of electrostatically induced power dissipation.

FIG. 36 is a perspective view of the structure of the inductor L1. As shown in FIG. 36, the inductor L1 is formed by winding wiring in spiral form and thus hereinafter referred to as a "spiral inductor SI". The center of the spiral, which is a first end of the spiral inductor SI, is connected to underlying wiring WL through a contact portion CP which passes through an interlayer insulation film not shown.

As has been described, it is common for semiconductor devices each with a high-frequency circuit to comprise a so-called spiral inductor. One side of the spiral inductor has a dimension of 100 to 200 μm, and an insulation layer whose dimensions are commensurate with those of the spiral inductor is provided in the surface of a wiring board under the spiral inductor. There is, however, a problem that the insulation layer with an excessively large area hampers miniaturization of the semiconductor devices, whereas the insulation layer with an excessively small area makes unignorable electrostatically induced power dissipation and electromagnetically induced power dissipation due to the spiral inductor.

SUMMARY OF THE INVENTION

A first aspect of the present invention is directed to a semiconductor device comprising: a semiconductor substrate; a first isolation oxide film provided in a main surface of the semiconductor substrate; and an inductance element provided on a region in which the first isolation oxide film is formed with an interlayer insulation film therebetween, wherein the first isolation oxide film is provided so that a horizontal distance between an end surface of the first isolation oxide film and a nearest one of end surfaces of the inductance element is not less than a vertical distance between a lower surface of the inductance element, which is opposed to the first isolation oxide film, and a surface of the semiconductor substrate.

A second aspect of the present invention is directed to a semiconductor device comprising: a semiconductor substrate; a first isolation oxide film provided in a main surface of the semiconductor substrate; an inductance element provided on a region in which the first isolation oxide film is formed with an interlayer insulation film therebetween; and a conductor layer provided at a height between the first isolation oxide film and the inductance element; wherein the conductor layer is provided so that a horizontal distance between an end surface of the conductor layer and a nearest one of end surfaces of the inductance element is not less than a vertical distance between a lower surface of the inductance element and a surface of the semiconductor substrate.

A third aspect of the present invention is directed to a semiconductor device comprising: a semiconductor substrate; a first isolation oxide film provided in a main surface of the semiconductor substrate; an inductance element provided on a region in which the first isolation oxide film is formed with an interlayer insulation film therebetween; and a dummy pattern region provided around the first isolation oxide film and divided by a second isolation oxide film having a smaller width than the first isolation oxide film in a plan view.

According to a semiconductor device of a fourth aspect of the present invention, the first isolation oxide film is provided so that a horizontal distance between each end surface of the first isolation oxide film and a nearest one of end surfaces of the inductance element is not less than a vertical distance between the lower surface of the inductance element and the surface of the semiconductor substrate.

According to a semiconductor device of a fifth aspect of the present invention, the semiconductor substrate is an SOI substrate comprising a substrate portion to be a foundation, a buried oxide film provided on the substrate portion, and an SOI layer provided on the buried oxide film; and the vertical distance is a vertical distance between the lower surface of the inductance element and a surface of the substrate portion.

According to a semiconductor device of a sixth aspect of the present invention, the first isolation oxide film includes a first portion having a first width and extending in a depth direction with respect to a surface of the buried oxide film, and a second portion having a second width smaller than the first width and being continuously formed under the first portion, extending in a depth direction with respect to the surface of the buried oxide film to reach the buried oxide film; and the end surface of the first isolation oxide film is an surface of the second portion.

According to a semiconductor device of a seventh aspect of the present invention, the first isolation oxide film has a predetermined width and extends in a depth direction with respect to a surface of the buried oxide film.

According to a semiconductor device of an eighth aspect of the present invention, the first isolation oxide film is rectangular in shape in a plane view; and the dummy pattern region has a width 5% or more of a length of a short side of the first isolation oxide film.

According to a semiconductor device of a ninth aspect of the present invention, the dummy pattern region includes a field portion defined by the second isolation oxide film; and an area ratio of the second isolation oxide film in the dummy pattern region to the field portion is set to be approximately 1:1.

In the semiconductor device of the first aspect, the first isolation oxide film is provided so that the horizontal distance between each end surface of the first isolation oxide film and a nearest one of end surfaces of the inductance element is not less than the vertical distance between the lower surface of the inductance element and the surface of the semiconductor substrate. This reduces parasitic capacitance between the inductance element and the semiconductor substrate in the vicinity of the end surfaces of the first isolation oxide film, resulting in a reduction in electrostatically induced power dissipation. Further, electromagnetically induced power dissipation can be reduced by decreasing perspective angles which are formed when the inductance element is viewed from the semiconductor substrate in the vicinity of the end surfaces of the first isolation oxide film.

In the semiconductor device of the second aspect, the conductor layer is provided so that the horizontal distance between each end surface of the conductor layer and a nearest one of end surfaces of the inductance element is not less than the vertical distance between the lower surface of the inductance element and the substrate of the semiconductor substrate. This reduces parasitic capacitance between the inductance element and the conductor layer, resulting in a reduction in electrostatically induced power, dissipation. Further, electromagnetically induced power dissipation can be reduced by decreasing perspective angles which are formed when the inductance element is viewed from the edge portions of the conductor layer.

The semiconductor device of the third aspect comprises, around the first isolation oxide film, the dummy pattern region which is divided by the second isolation oxide film having a small width in the plane view. Thus, when the first isolation oxide film is formed by CMP, dishing in the first isolation oxide film would not extend beyond the dummy pattern region. This prevents the extension of dishing to the transistor formation regions.

In the semiconductor device of the fourth aspect, electrostatically induced power dissipation and electromagnetically induced power dissipation can be reduced in either structure: the structure wherein the conductor layer is provided at a height between the first isolation oxide film and the inductance element: and the structure wherein the dummy pattern region including the second isolation oxide film is provided around the first isolation oxide film.

In the semiconductor device of the fifth aspect, the semiconductor substrate is the SOI substrate. This ensures element isolation and allows the use of a minimal width of the isolation oxide film, the width being determined by micro-lithography. Thus, downsizing of the device can be achieved.

In the semiconductor device of the sixth aspect, the first isolation oxide film is a complete isolation oxide film including in part a so-called partial isolation oxide film. The first isolation oxide film is comprised of a first portion having the first width and extending in the depth direction with respect to the surface of the buried oxide film, and a second portion having the second width smaller than the first width and being formed under the first portion, extending in the depth direction with respect to the surface of the buried oxide film to reach that buried oxide film. In such a semiconductor device that provides element isolation with a partial isolation oxide film, therefore, the first isolation oxide film can be formed in the process of forming the partial isolation oxide film to provide element isolation. This simplifies the manufacturing.

In the semiconductor device of the seventh aspect, the first isolation oxide film is a so-called complete isolation oxide film which has a predetermined width and extends in the depth direction with respect to the surface of the buried oxide film. In such a semiconductor device that provides element isolation with a complete isolation oxide film, therefore, the first isolation oxide film can be formed in the process of forming the complete isolation oxide film to provide element isolation. This simplifies the manufacturing process. Further, this first isolation film has no area of thin in thickness and high resistance, unlike those including in part the partial isolation oxide film. This allows a reduction in electromagnetically induced power dissipation in that film.

In the semiconductor device of the eighth aspect, the dummy pattern region has the width 5% or more of the length of the short sides of the first isolation oxide film. This prevents dishing from extending beyond the dummy pattern region.

In the semiconductor device of the ninth aspect, the area ratio of the second isolation oxide film in the dummy pattern region to the field portion is set to be approximately 1:1 in the plane view. This effectively prevents dishing from extending beyond the dummy pattern region.

An object of the present invention is to provide a semiconductor device with a spiral inductor, which determines the area of an insulation layer to be provided in the surface of a wiring board under the spiral inductor.

These and other objects, features, aspects and advantages of the present invention will become more apparent from the following detailed description of the present invention when taken in conjunction with the accompanying drawings.

DESCRIPTION OF THE PREFERRED EMBODIMENTS

<Introduction>

Figure 1:
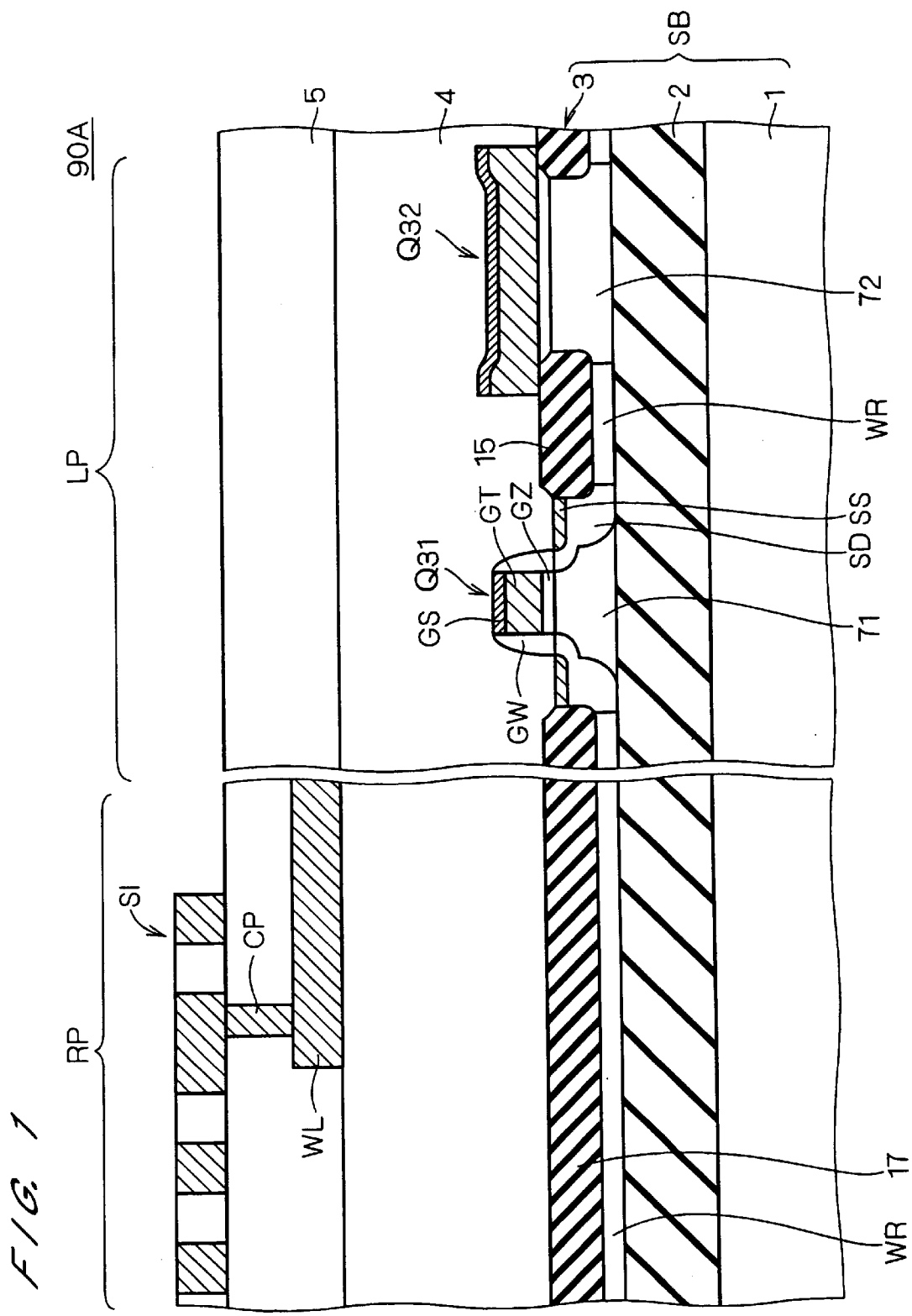
FIG. 1 is a cross-sectional view showing one example of the structure of a semiconductor device with a spiral inductor.

Prior to descriptions of preferred embodiments of a semiconductor device according to the present invention, the structure of a semiconductor device 90A is illustrated in FIG. 1 as one example of a semiconductor device with a spiral inductor.

FIG. 1 shows only part of the semiconductor device 90A. Taking the semiconductor device 90 illustrated in FIG. 35 as an example, part of the RF circuit portion 91 and the logic portion 92 are shown, respectively, as an RF circuit portion RP and a logic portion LP.

Referring to FIG. 1, the RF circuit portion RP and the logic portion LP are provided on an SOI substrate SB which is comprised of a silicon substrate 1, a buried oxide film 2 provided on the silicon substrate 1, and an SOI layer 3 provided on the buried oxide film 2.

Figure 36:
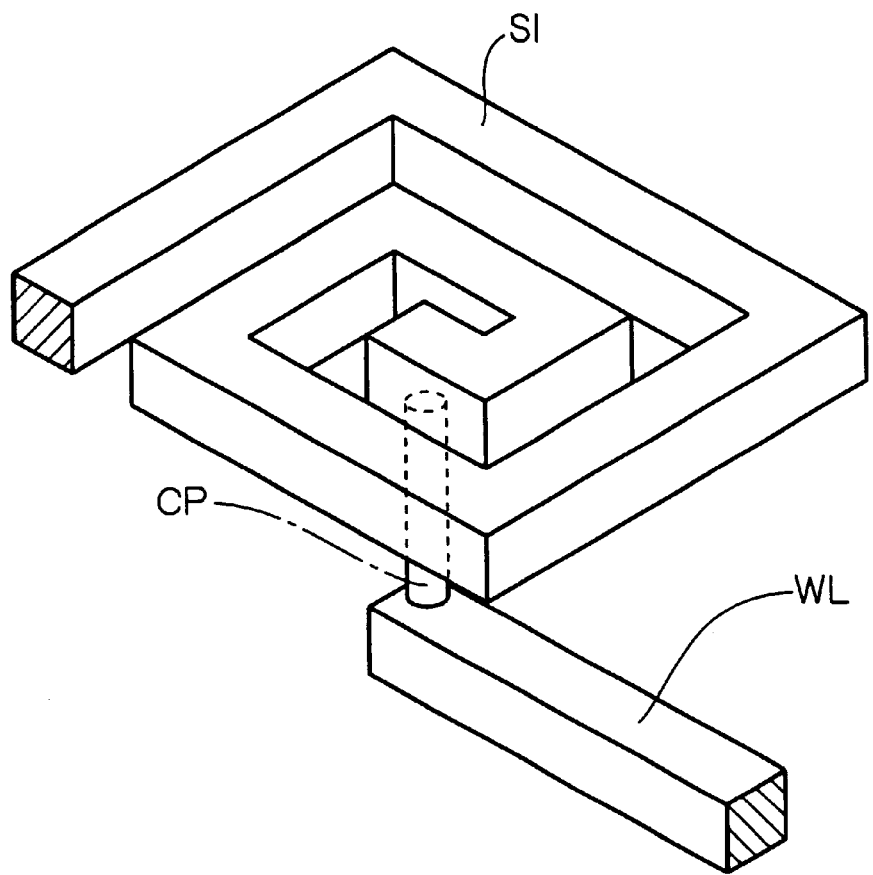
FIG. 36 is a perspective view of the structure of a spiral inductor.

In the RF circuit portion RP, a trench isolation oxide film 17 is provided in an area of the SOI layer 3 that corresponds to the area of a spiral inductor SI (see FIG. 36 for the planar structure of the spiral inductor). The trench isolation oxide film 17 extends to the logic portion LP. In the logic portion LP, the SOI layer 3 is divided into two SOI regions 71 and 72 by a trench isolation oxide film 15, and MOS transistors Q31 and Q32 are formed on the SOI regions 71 and 72, respectively.

The MOS transistors Q31 and Q32 each comprise a gate insulating film GZ provided on the SOI region 71 or 72, a gate electrode GT provided on the gate insulating film GZ, a silicide film GS provided on the gate electrode GT, and a sidewall insulation film GW provided to cover the side faces of, respectively, the above films. These MOS transistors Q31 and Q32 are of a common type with no special character in their structures and manufacturing method.

As for the MOS transistor Q31, there are further a silicide film SS provided in the surface of the SOI region 71 outside the sidewall insulation film GW, and source/drain regions SD. It is needless to say that the MOS transistor Q32 is of the same structure, but such a structure cannot be seen just because the figure shows the cross section of the MOS transistor Q32 taken longitudinally of the gate electrode GT.

An interlayer insulation film 4, formed for example of a silicon oxide film, is provided to cover the whole surface of the SOI substrate SB, and wiring WL is provided on the interlayer insulation film 4 to provide an electrical connection between the spiral inductor SI and the MOS transistor 31.

An interlayer insulation film 5, formed for example of a silicon oxide film, is provided to cover the surface of the interlayer insulation film 4, and the spiral inductor SI is provided on the interlayer insulation film 5. One end of the spiral inductor SI is connected to the wiring WL through the contact portion CP which reaches the wiring WL through the interlayer insulation film 5. The wiring WL is electrically connected to semiconductor elements such as MOS transistors, but such electrical connections are not shown in the figure.

As contrasted to the trench isolation oxide films 15 and 17 which provide complete electrical isolation between the SOI regions, isolation oxide films under which the SOI layer 3 is provided as a well region WR are referred to as "partial isolation oxide films".

<Partial Isolation Oxide Film>

Now, a brief description of the partial isolation oxide films is presented. In principle, the MOS transistors, each being completely electrically isolated from other elements by a complete isolation oxide film, produce no latchup with other MOS transistors.

Thus, the manufacture of SOI devices, each with CMOS transistors, using a complete isolation oxide film has had the merit of being able to use a minimum isolation width which is determined by micro-lithography and thereby to reduce chip area. However, such SOI devices are affected by substrate floating body effects such as kinks in current-voltage characteristics due to carriers (holes for NMOS transistors) caused by impact ionization and then stored in the channel formation region (body region); degradation in operating breakdown voltage; and the dependence of delay time on frequency because of unstable electric potential in the channel formation region.

In this regard, the partial isolation oxide films, which are also called partial trench isolation, have been devised. Taking the structure of FIG. 1 as an example, carriers are movable through the well region WR under the partial isolation oxide film 15. This prevents carriers from being stored in the channel forming region and allows the electric potential in the channel forming region to be fixed through the well region WR. Accordingly, no problems are caused by the substrate floating body effects.

Figure 35:
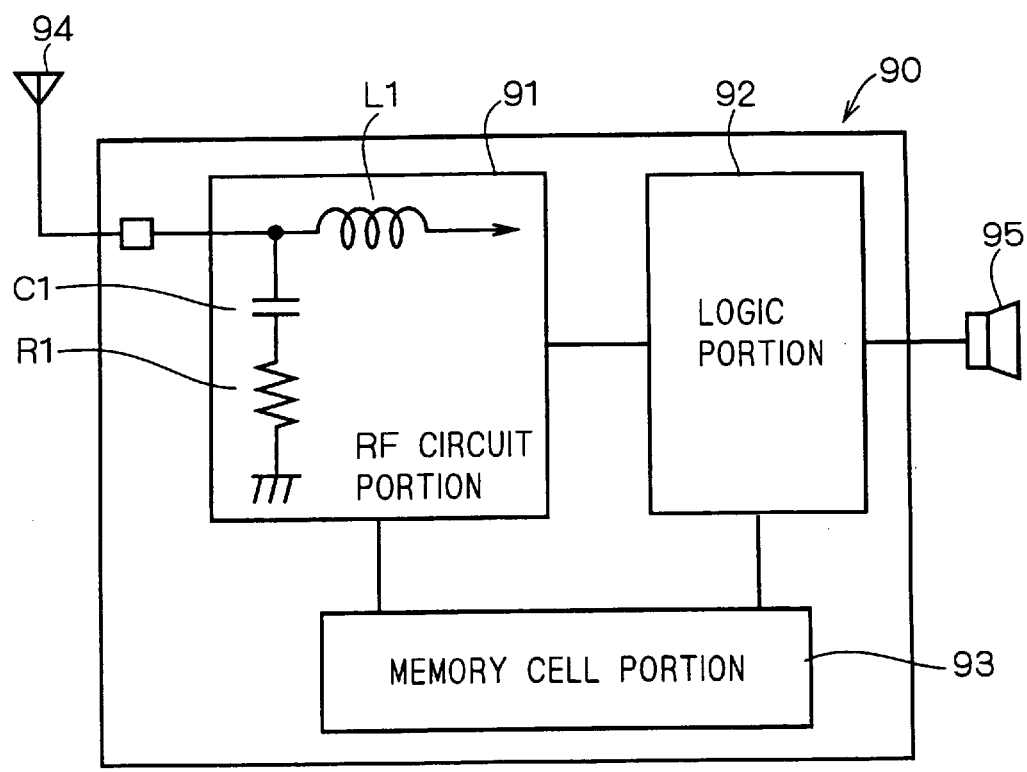
FIG. 35 is a block diagram showing one example of the structure of a semiconductor device with a high-frequency circuit.

Referring back to FIG. 1, the semiconductor device 90A is so constructed that the partial isolation oxide film or trench isolation oxide film 17 is provided in the area of the SOI layer 3 corresponding to the area of the spiral inductor SI. This is because the partial isolation oxide film, which is used in the logic portion LP, is also used in the RF circuit portion RP in terms of simplification of the manufacturing process. However, the well region WR under the trench isolation oxide film 17 is thin and has high values of resistance because of its low impurity concentration. Thus, the parasitic capacitance C1 in the inductor L1 illustrated in FIG. 35 is grounded through the well region WR and the value of the resistor R1 in FIG. 35 becomes high. As the value of the resistor R1 increases, more power is consumed by electrostatically induced power dissipation. Further, a flow of current through the spiral inductor SI produces eddy current in the well region WR, which leads to electromagnetically induced power dissipation.

The inventors of the present invention have thus devised a structure that will reduce electrostatically induced power dissipation and electromagnetically induced power dissipation, by forming an oxide film, instead of the well region WR, under the trench isolation oxide film 17.

Figure 2:
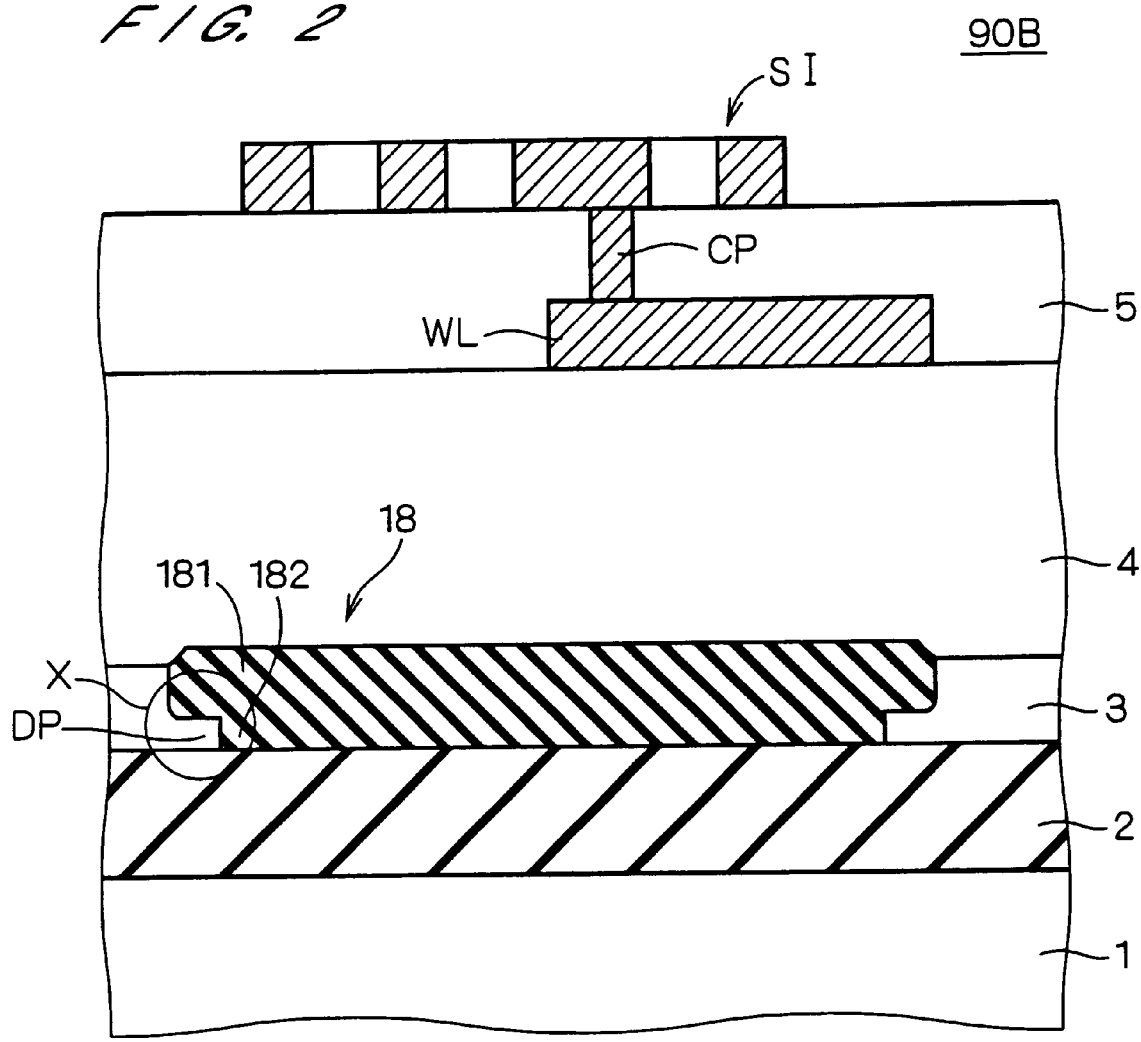
FIG. 2 is a cross-sectional view showing one example of the structure of a semiconductor device with a spiral inductor provided above a complete isolation oxide film which includes in part a partial isolation oxide film.

FIG. 2 shows a semiconductor device 90B with such a structure. For the sake of simplicity, only the spiral inductor SI and the structure thereunder are depicted in FIG. 2. The semiconductor device 90B is in all other aspects identical to the semiconductor device 90A in FIG. 1. The same reference numerals as in FIG. 1 designate like or corresponding parts and no mention is made here to avoid duplication.

The semiconductor device 90B in FIG. 2 is constructed such that a trench isolation oxide film 18, which is a complete isolation oxide film including in part a partial isolation oxide film, is provided in an area of the SOI layer 3 which corresponds to the area of the spiral inductor SI.

The trench isolation oxide film 18 is comprised of a first portion 181 having a first width and extending in a direction approximately perpendicular to the surface of the buried oxide film 2, and a second portion 182 having a second width smaller than the first width and being continuously formed under the first portion 181, extending approximately perpendicular to the surface of the buried oxide film 2. At least the second portion 182 is provided to correspond to the area of the spiral inductor SI.

With such a structure, the semiconductor device 90B can reduce electrostatically induced power dissipation and electromagnetically induced power dissipation over the semiconductor device 90A in FIG. 1. In regions or edge portions X of the trench isolation oxide film 18, however, the SOI layer 3 extends under the first portion 181, forming protrusions DP.

The protrusions DP, like the well region WR under the trench isolation oxide film 17 in FIG. 1, have high values of resistance and the inventors of the present invention had realized that electrostatically induced power dissipation and electromagnetically induced power dissipation were unignorable in such a structure. They have thus conducted an analysis of electrostatically induced power dissipation and electromagnetically induced power dissipation and come to achieve a structure that will allow a further reduction in the above dissipation.

<A. First Preferred Embodiment>
<A-1. Device Structure>

Figure 3:
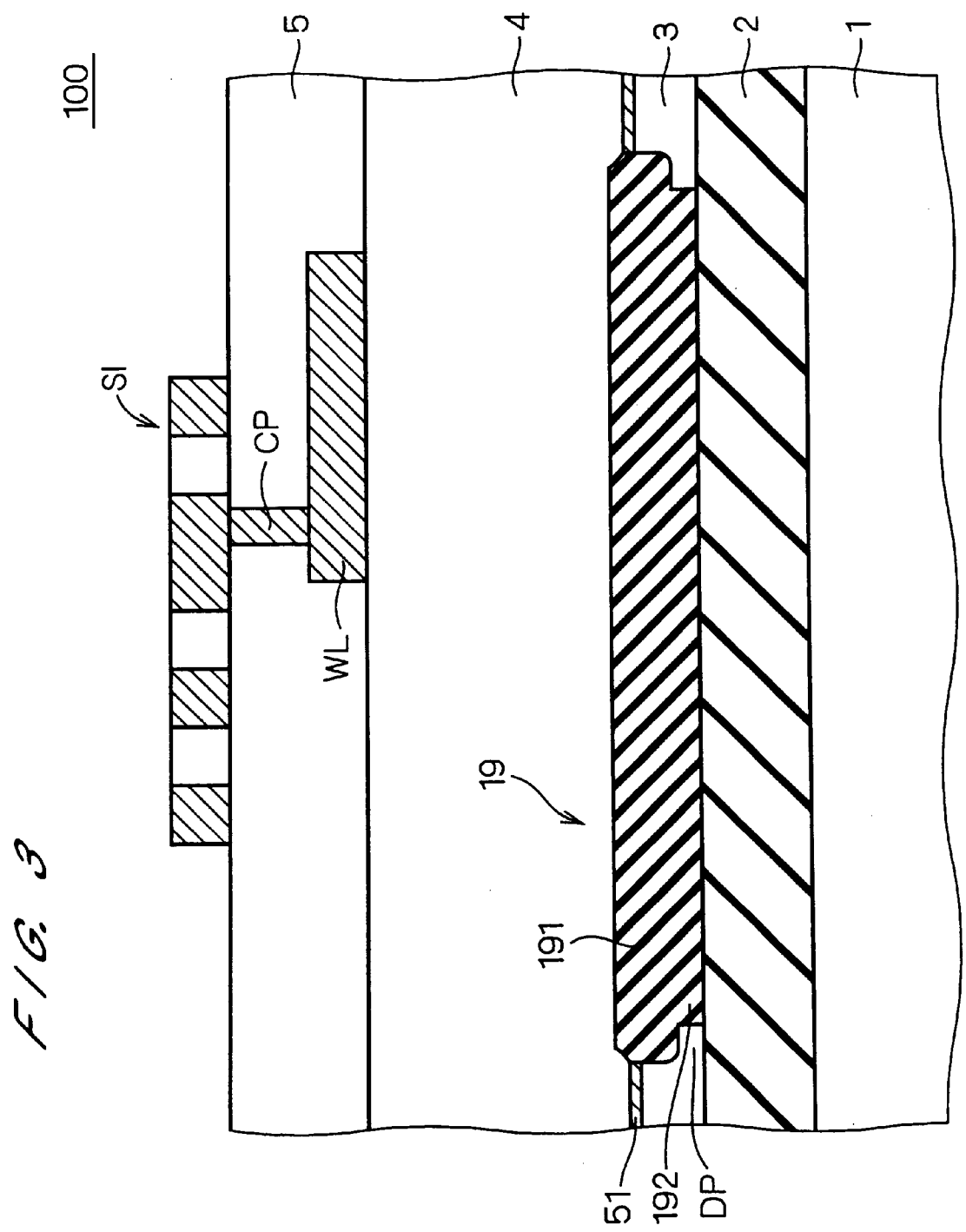
FIG. 3 is a cross-sectional view of the structure of a semiconductor device according to a first preferred embodiment of the present invention.

Now, the structure of a semiconductor device 100 that will further reduce electrostatically induced power dissipation and electromagnetically induced power dissipation is illustrated in FIG. 3 as a first preferred embodiment of the semiconductor device according to the present invention. For the sake of simplicity, only the spiral inductor SI and the structure thereunder are shown in FIG. 3. The semiconductor device 100 is In all other aspects identical to the semiconductor device 90A shown in FIG. 1. The same reference numerals as in FIG. 1 designate like or corresponding parts and no mention is made here to avoid duplication.

The semiconductor device 100 in FIG. 3 is constructed such that a trench isolation oxide-film 19, which is a complete isolation oxide film including in part the structure of a partial isolation oxide film, is provided in a larger area of the surface of the SOI layer 3 than that corresponding to the area of the spiral inductor SI.

Further, a silicide film 51 is provided on the main surface of the SOI layer 3 around the trench isolation oxide film 19.

The trench isolation oxide film 19 is comprised of a first portion 191 having a first width and extending in a direction approximately perpendicular to the surface of the buried oxide film 2, and a second portion 192 having a second width smaller than the first width and being continuously formed under the first portion 191, extending approximately perpendicular to the surface of the buried oxide film 2. It is provided such that a horizontal distance between each end surface of the second portion 192 (i.e., the end surface of each protrusion DP of the SOI layer 3 under the first portion 191) and the nearest end surface of a plurality of sides of the spiral inductor SI makes a predetermined distance or more.

Here, the second portion 192 of a smaller width than the first portion 191 corresponds to the structure of a complete isolation oxide film.

Figure 4:
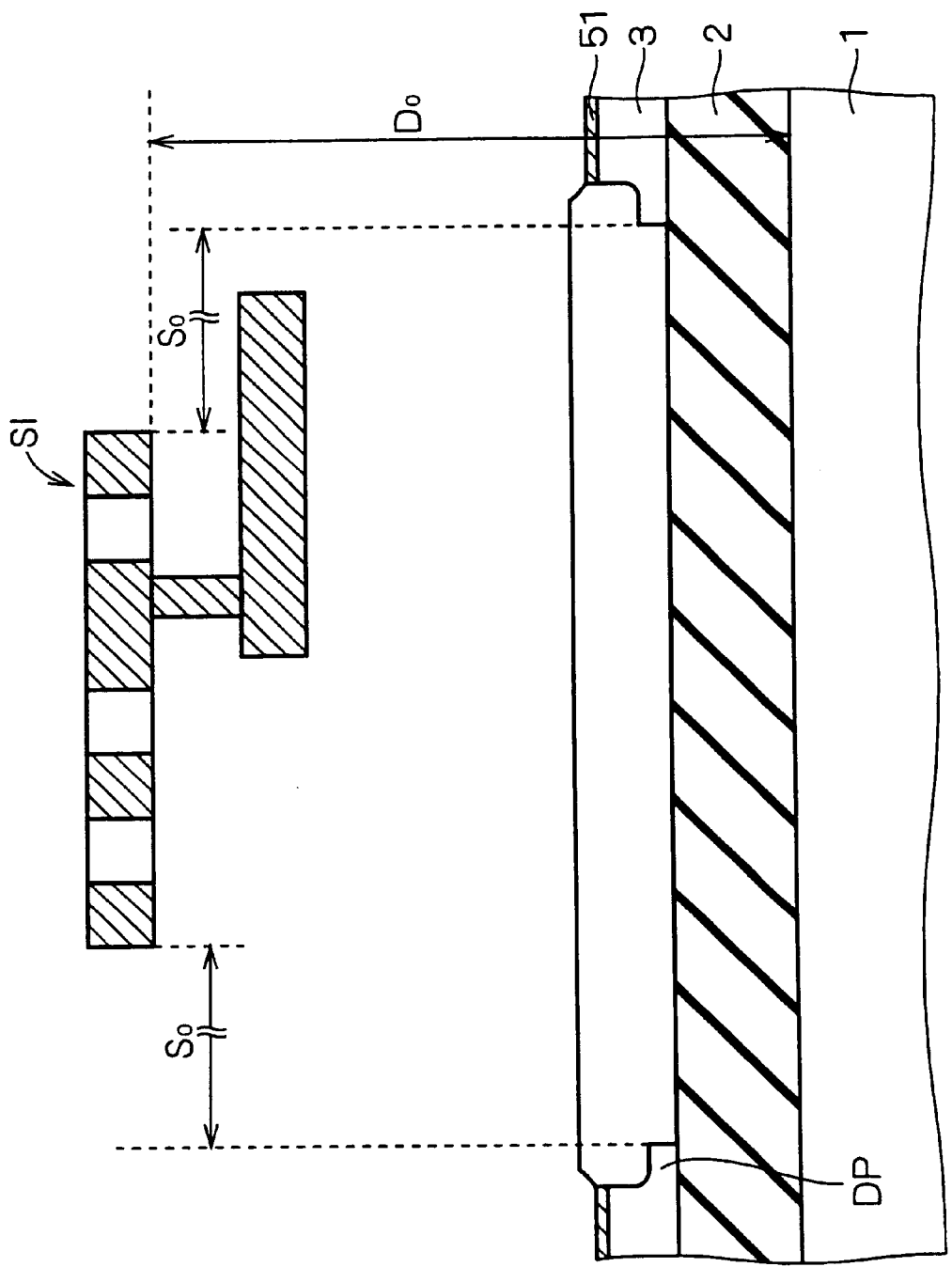
FIG. 4 is a cross-sectional view showing clearly the features of the structure of the semiconductor device according to the first preferred embodiment of the present invention.

The details of this structure will now be described with reference to FIG. 4. FIG. 4 simplifies the structure in FIG. 3, omitting the hatching of the trench isolation oxide film 19, and the interlayer insulation films 4 and 5.

Referring to FIG. 4, the horizontal distance between the end surface of each protrusion DP of the SOI layer 3 and the nearest end surface of the spiral inductor SI is indicated by $S_0$ and a distance between the lower surface of the spiral inductor SI and the upper main surface of the silicon substrate 1 is indicated by $D_0$. In FIG. 4, the aspect ratio is not correct and so is the ratio of the distance $S_0$ to the size of the spiral inductor SI. To emphasize the distance $S_0$, the distance $S_0$ is shown on a larger scale than the spiral inductor SI.

The distance $S_0$ is set to be not less than the distance $D_0$ ($S_0 \geq D_0$), to thereby reduce electrostatically induced power dissipation and electromagnetically induced power dissipation at the protrusions DP of the SOI layer 3.

That is, as the distance $S_0$ (the distance between the protrusion DP of the SOI layer 3 and the spiral inductor SI) increases, the parasitic capacitance between the protrusion DP and the spiral inductor SI decreases and electrostatically induced power dissipation are reduced. Further, electromagnetically induced power dissipation can be reduced by decreasing perspective angles which are when the spiral inductor SI is viewed from the protrusions DP.

Figure 5:
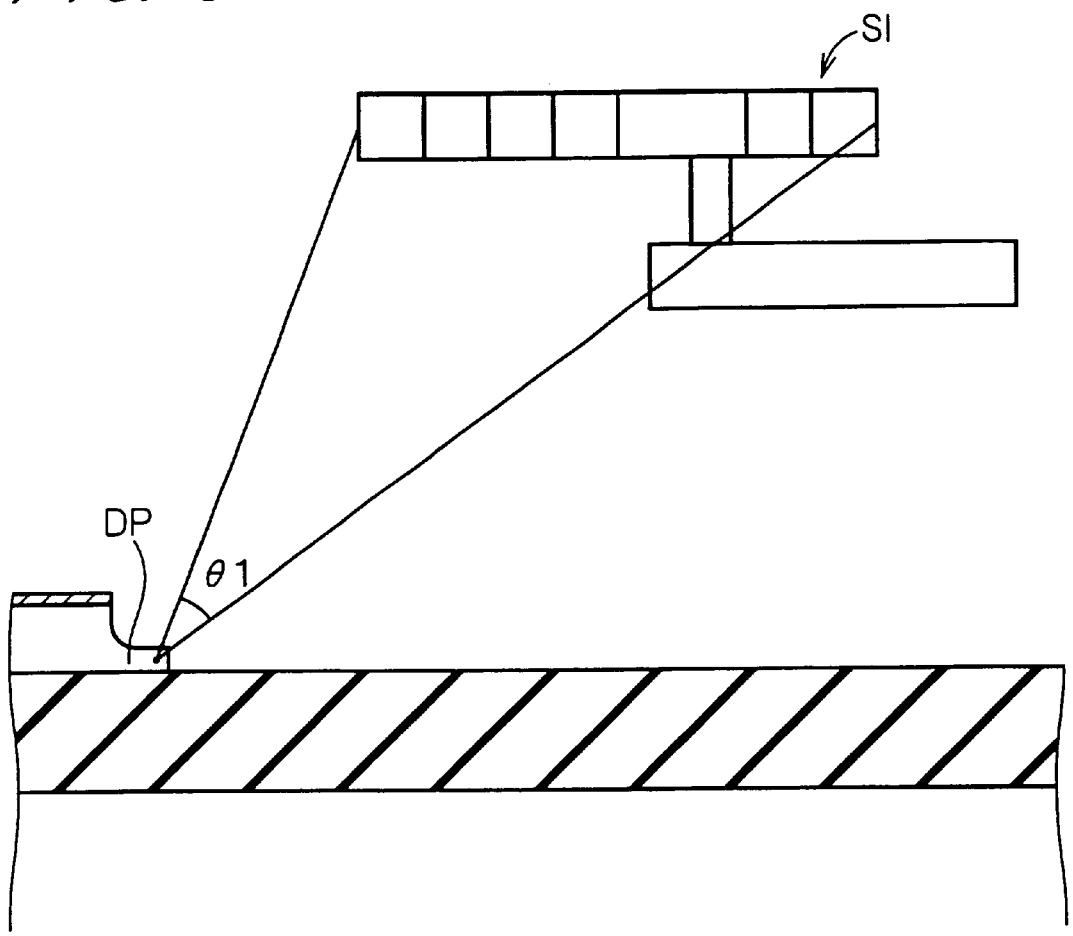
FIG. 5 is a cross-sectional view illustrating the effects of the structure of the semiconductor device according to the first preferred embodiment of the present invention.

Description will now be made in further detail of the reduction in electromagnetically induced power dissipation with reference to FIGS. 5 through 7. FIG. 5 shows an perspective angle θ1 which is formed when the spiral inductor SI is viewed from one of the protrusions DP. The perspective angle is defined as an angle formed by the centers of two opposed end surfaces of the spiral inductor SI with one point at the protrusion DP as a vertex.

Figure 6:
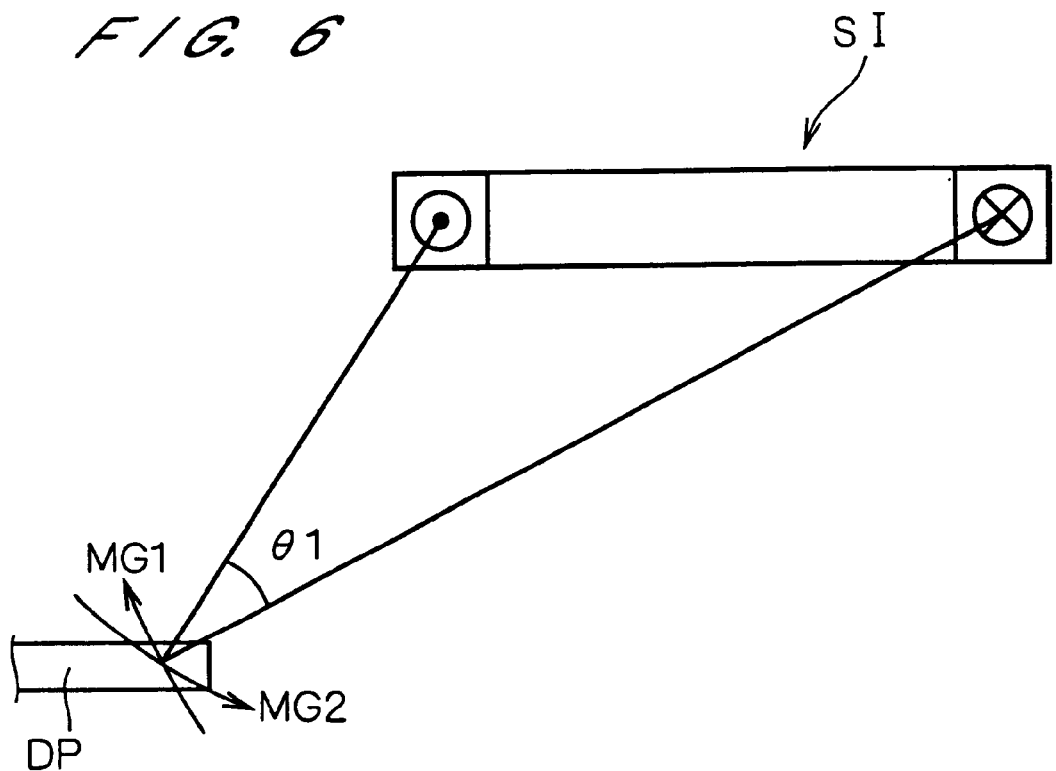
FIGS. 6 and 7 are schematic diagrams illustrating the effects of the structure of the semiconductor device according to the first preferred embodiment of the present invention.
Figure 7:
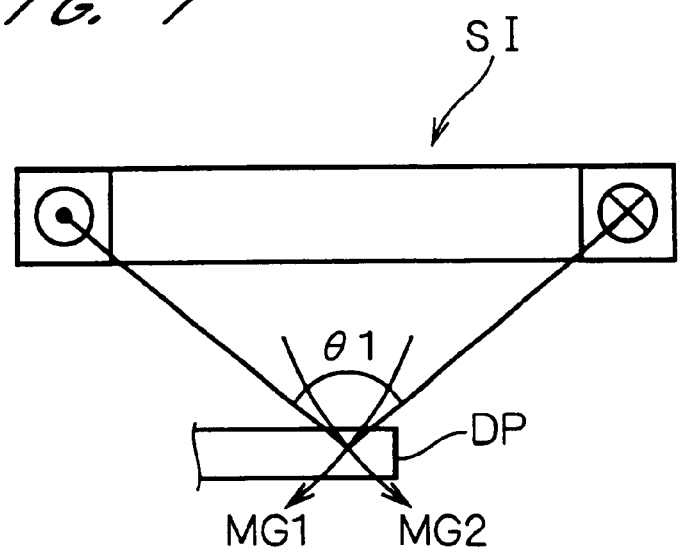

FIGS. 6 and 7 schematically illustrates electromagnetically induced power dissipation due to the spiral inductor SI. FIG. 6 shows the case for a relatively small perspective angle θ1; and FIG. 7 shows the case for a relatively large perspective angle θ1, in either of which the flow of current on the two opposed sides of the spiral inductor SI are indicated by symbols.

On the right and left sides of the spiral inductor SI, the directions of current flowing at a certain moment are diametrically opposed to each other and magnetic fields induced by such current flow on those side are directed differently. When the perspective angle θ1 is relatively small as shown in FIG. 6, magnetic fields MG1 and MG2 at the protrusion DP, which are established respectively by the left and right sides of the spiral inductor SI, are directed almost oppositely and cancel each other out, thereby reducing electromagnetically induced power dissipation. This effect becomes more remarkable as the perspective angle θ1 decreases, i.e., as the horizontal distance $S_0$ between the end surface of one protrusion DP and a corresponding end surface of the spiral inductor SI increases. On the contrary, larger perspective angles θ1 increase electromagnetically induced power dissipation. An extreme case is shown in FIG. 7

In FIG. 7, the end surface of one protrusion DP is at some distance from a corresponding end surface of the spiral inductor SI, but the relative fore-and-aft positions of them are different from those in FIG. 6 in that the perspective angle θ1 is large. Thus, the magnetic fields MG1 and MG2 at the protrusion DP, which are established respectively by the left and right sides of the spiral inductor SI, are oriented about in the same direction and intensify each other, thereby increasing electromagnetically induced power dissipation. Here, how to reduce electrostatically induced power dissipation will be described later in a fourth preferred embodiment.

<A-2. Effects>

As have been described, by setting the horizontal distances $S_0$ between the end surfaces of the protrusions DP of the SOI layer 3 and corresponding end surfaces of the spiral inductor SI to be not less than the distance $D_0$ between the lower surface of the spiral inductor SI and the upper main surface of the silicon substrate 1, electromagnetically induced power dissipation at the protrusions DP can be reduced as well as electrostatically induced power dissipation can.

An increase in electrostatically induced power dissipation and electromagnetically induced power dissipation will reduce the Q factor (the factor obtained by dividing energy stored in the inductor by various types of dissipation) which represent inductor performance. That is, reducing the electrostatically induced power dissipation and electromagnetically induced power dissipation will contribute to an increase in the Q factor, i.e., an improvement in performance, resulting in an increase in efficiency of circuitry and a reduction in noise figure.

One example is that the distance $S_0$ and the distance $D_0$ are approximately 8 μm and 4 μm, respectively. The distance $D_0$, which is determined by the basic structure of the semiconductor device, is difficult to change substantially, but the distance $S_0$ can easily be changed by changing the layout of the trench isolation oxide film 19. Further, since one side of the spiral inductor SI is large (about 100 to 200 μm) in dimension, the whole area of the semiconductor device would not extremely be increased even if the distance $S_0$ is somewhat increased.

When the distance $S_0$ is 8 μm as above described and the spiral inductor SI has a dimension of 200 μm, for example, the area of the semiconductor device will be increased by only about 1.2 times what it is when the distance $S_0$ is 0, i.e., when the spiral inductor SI and the trench isolation oxide film 19, have about the same area.

<A-3. First Modification>

The aforementioned semiconductor device 100 is so constructed that the trench isolation oxide film 19, which is a complete isolation oxide film including in part the structure of a partial isolation oxide film, is provided in a larger area of the surface of the SOI layer 3 than that corresponding to the area of the spiral inductor SI. This trench isolation oxide film 19, may be replaced with a trench isolation oxide film 20, which is a complete isolation oxide film, as illustrated in a semiconductor device 100A of FIG. 8.

In this structure, the trench isolation oxide film 20 has a predetermined width and extends approximately perpendicular to the surface of the buried oxide film 2. The trench isolation oxide film 20 is provided such that the horizontal distance between each end surface of the trench isolation oxide film 20 (i.e., the end surface of the SOI layer 3) and a corresponding end surface of the spiral inductor SI makes a distance $S_2$.

Figure 8:
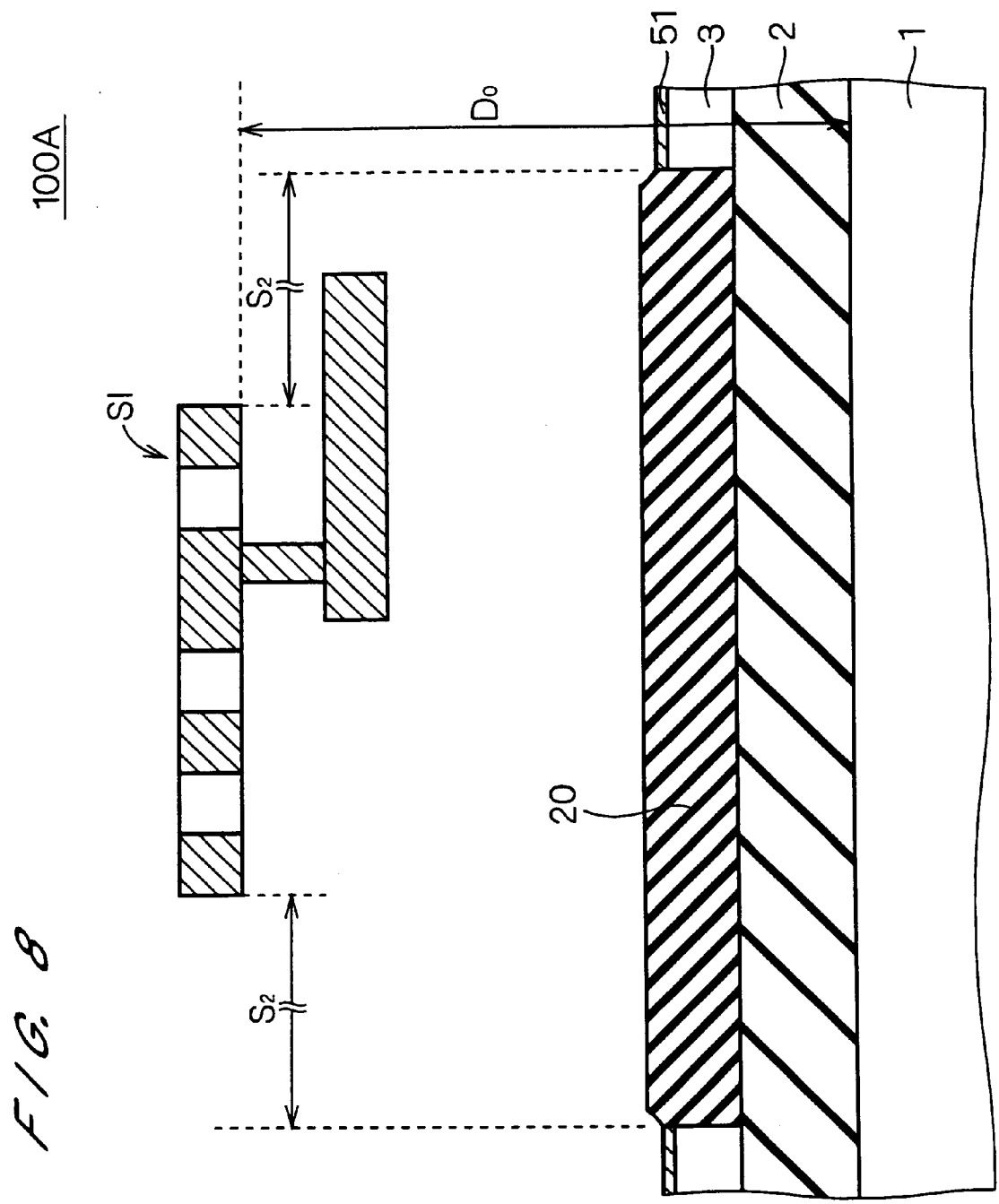
FIG. 8 is a cross-sectional view of the structure of a first modification in the semiconductor device according to the first preferred embodiment of the present invention.

In FIG. 8, the aspect ratio is not correct and so is the ratio of the distance $S_2$ to the size of the spiral inductor SI. To emphasize the distance $S_2$, the distance $S_2$ is shown on a larger scale than the spiral inductor SI.

By setting the distance $S_2$ to be not less than the distance $D_0$ ($S_2 \geq D_0$), the semiconductor device 100A, like the semiconductor device 100, can reduce electrostatically induced power dissipation and electromagnetically induced power dissipation at the edge portions of the SOI layer 3.

In the semiconductor device 100A, the silicide film 51 is provided on the main surface of the SOI layer 3 around the trench isolation oxide film 20 as in the semiconductor device 100. The silicide film 51 is formed for example by disposing a metal film such as cobalt or titanium on the SOI layer 3 and then causing silicidation of the metal film by the silicidation reaction. The silicide film 51 has a lower value of resistance than the SOI layer 3 and thus current can easily flow to the ground through the SOI layer 3. This further reduces electrostatically induced power dissipation, thereby contributing to improvements in the Q factor.

<A-2. Second Modification>

While the aforementioned semiconductor devices 100 and 100A are both formed on the SOI substrates SB, it is to be understood that the application of the present invention is not limited to the SOI substrate. In fact, the present invention is applicable for example to silicon substrates called the bulk substrate.

Figure 9:
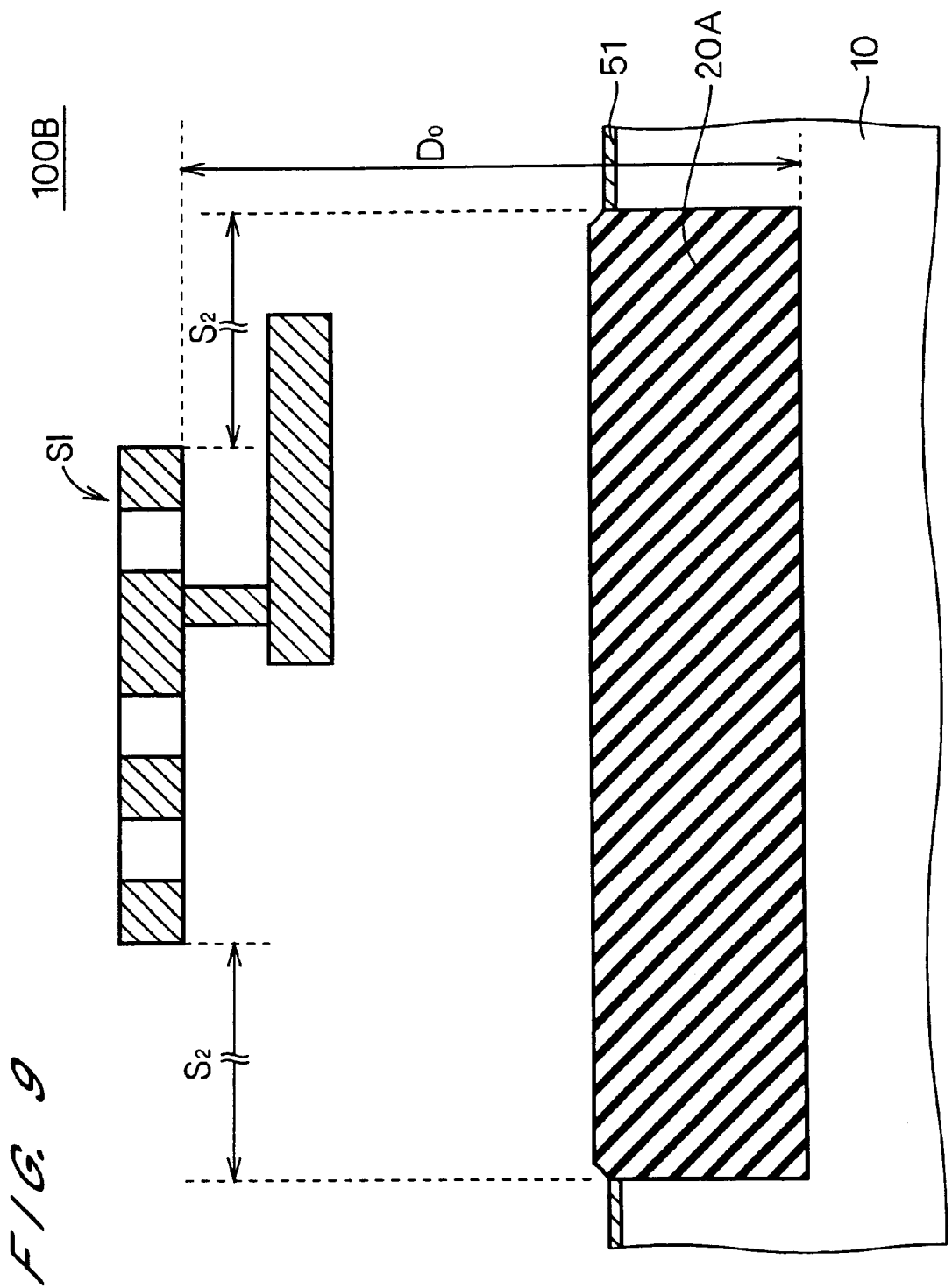
FIG. 9 is a cross-sectional view of the structure of a second modification in the semiconductor device according to the first preferred embodiment of the present invention.

More specifically, as illustrated in a semiconductor device 100B of FIG. 9, a trench isolation oxide film 20A may be provided in a larger area of the surface of a silicon substrate 10 than that corresponding to the area of the spiral inductor SI.

In this structure, the trench isolation oxide film 20A of a predetermined with is formed almost perpendicularly in the silicon substrate 10. The trench isolation oxide film 20A is provided such that a horizontal distance between each end surface of the trench isolation oxide film 20A (i.e., the end surface of the silicon substrate 10) and a corresponding end surface of the spiral inductor SI makes the distance $S_2$.

By setting the distance $S_2$ to be not less than the distance $D_0$ ($S_2 \geq D_0$), the semiconductor device 100B, like the semiconductor device 100A, can reduce electrostatically induced power dissipation and electromagnetically induced power dissipation at the edge portions of the silicon substrate 10.

<B. Second Preferred Embodiment>

<B-1. Device Structure>

In the structures of the aforementioned first preferred embodiment, the layout of the trench isolation oxide film, which is provided in the surface of the semiconductor substrate under the spiral inductor, has been devised to reduce electrostatically induced power dissipation and electromagnetically induced power dissipation in the semiconductor substrate in the vicinity of the interface between the semiconductor substrate and the trench isolation oxide film. However, it is to be understood that the application of the present invention is not limited to the layout of the trench isolation oxide film. In fact, the present invention is also applicable to the layout of various conductor layers such as wiring layers.

Figure 10:
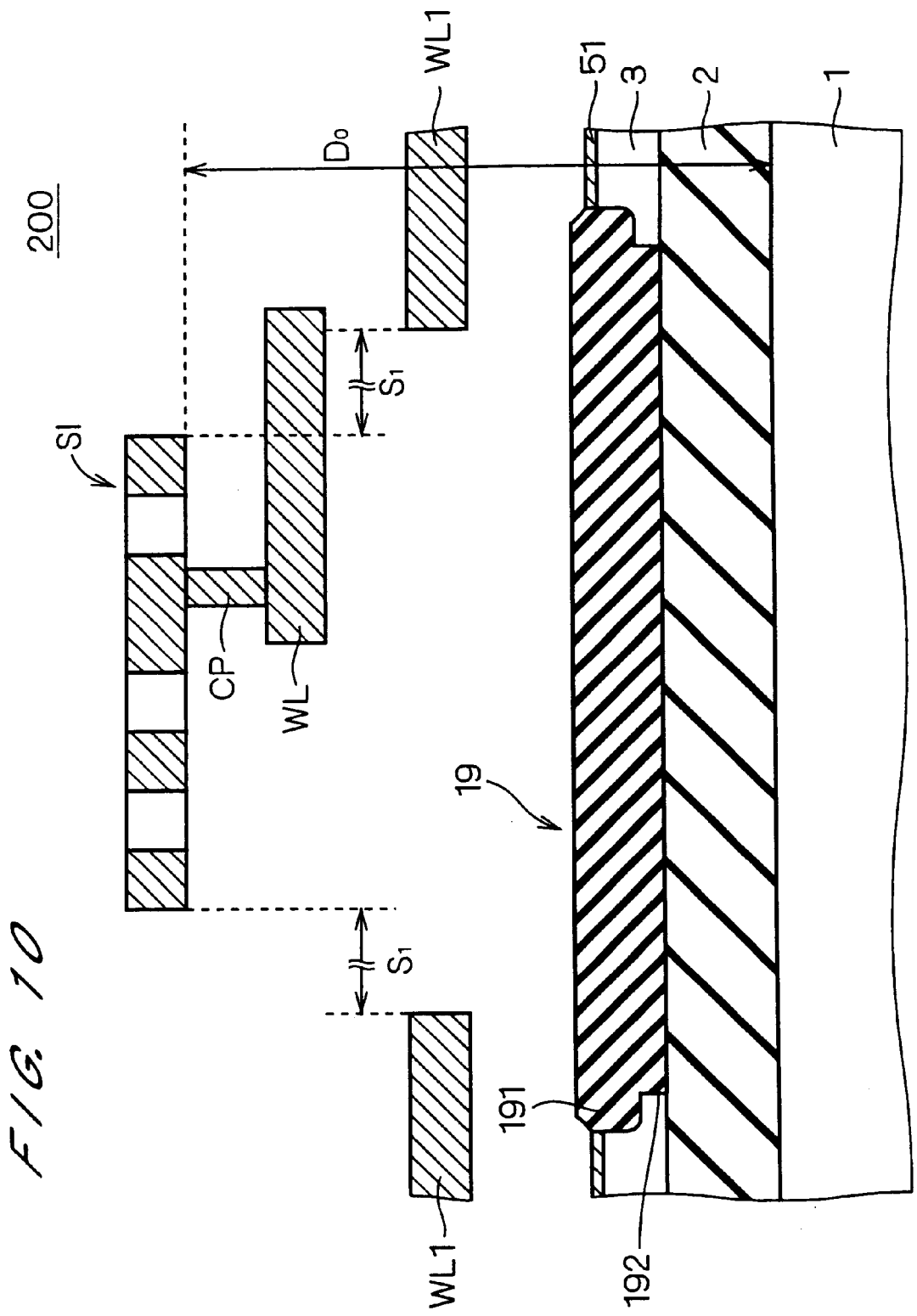
FIG. 10 is a cross-sectional view of the structure of a semiconductor device according to a second preferred embodiment of the present invention.

FIG. 10 shows the structure of a semiconductor device 200 as a second preferred embodiment of the semiconductor device according to the present invention.

For the sake of simplicity, only the spiral inductor SI and the structure thereunder are shown in the figure. The semiconductor device 200 is in all other aspects identical to the semiconductor device 90A shown in FIG. 1. The same reference numerals as in FIG. 1 designate like or corresponding parts and no mention is made here to avoid duplication.

The semiconductor device 200 in FIG. 10 is similar to the semiconductor device 100 illustrated in FIG. 3 in that the trench isolation oxide film 19, is provided in the surface of the SOI layer 3, but it is different in that a wiring layer WL1 is provided in an interlayer insulation film (not shown) above the trench isolation oxide film 19.

The wiring layer WL1 is provided such that a horizontal distance between each end surface of the wiring layer WL1 and the nearest end surface of the spiral inductor SI makes the distance $S_1$.

In FIG. 10, the aspect ratio is not correct and so is the ratio of the distance $S_0$ to the size of the spiral inductor SI. To emphasize the distance $S_0$, the distance $S_0$ is shown on a larger scale than the spiral inductor SI.

By setting the distance $S_1$ to be not less than the distance $D_0$ ($S_1 \geq D_0$), parasitic capacitance between the wiring layer WL1 and the spiral inductor SI is reduced and thereby electrostatically induced power dissipation is reduced. Further, electromagnetically induced power dissipation can be reduced by decreasing perspective angles which are formed when the spiral inductor SI is viewed from the edge portions of the wiring layer WL.

The wiring layer WL1 may be either a metal or a polysilicon wiring layer as long as it is a conductor layer. It may also be a conductor layer, such as a dummy pattern of metal wires, which is formed in the installation of those metal wires. Such a dummy pattern is provided to prevent the metal wires from being too well spaced, to thereby improve planarity when the interlayer insulation film is planarized by CMP (Chemical Mechanical Polishing) processing in such a structure that the metal wires are covered with the interlayer insulation film.

In this fashion, electrostatically induced power dissipation and electromagnetically induced power dissipation can be reduced by avoiding as much as possible placement of layers to be conductors including wiring layers, under the spiral inductor SI.

<B-2. Modification>

While the aforementioned semiconductor device 200 is formed on the SOI substrate SB, it is to be understood that the application of the present invention is not limited to the SOI substrate. In fact, the present invention is also applicable to silicon substrates called the bulk substrate.

Figure 11:
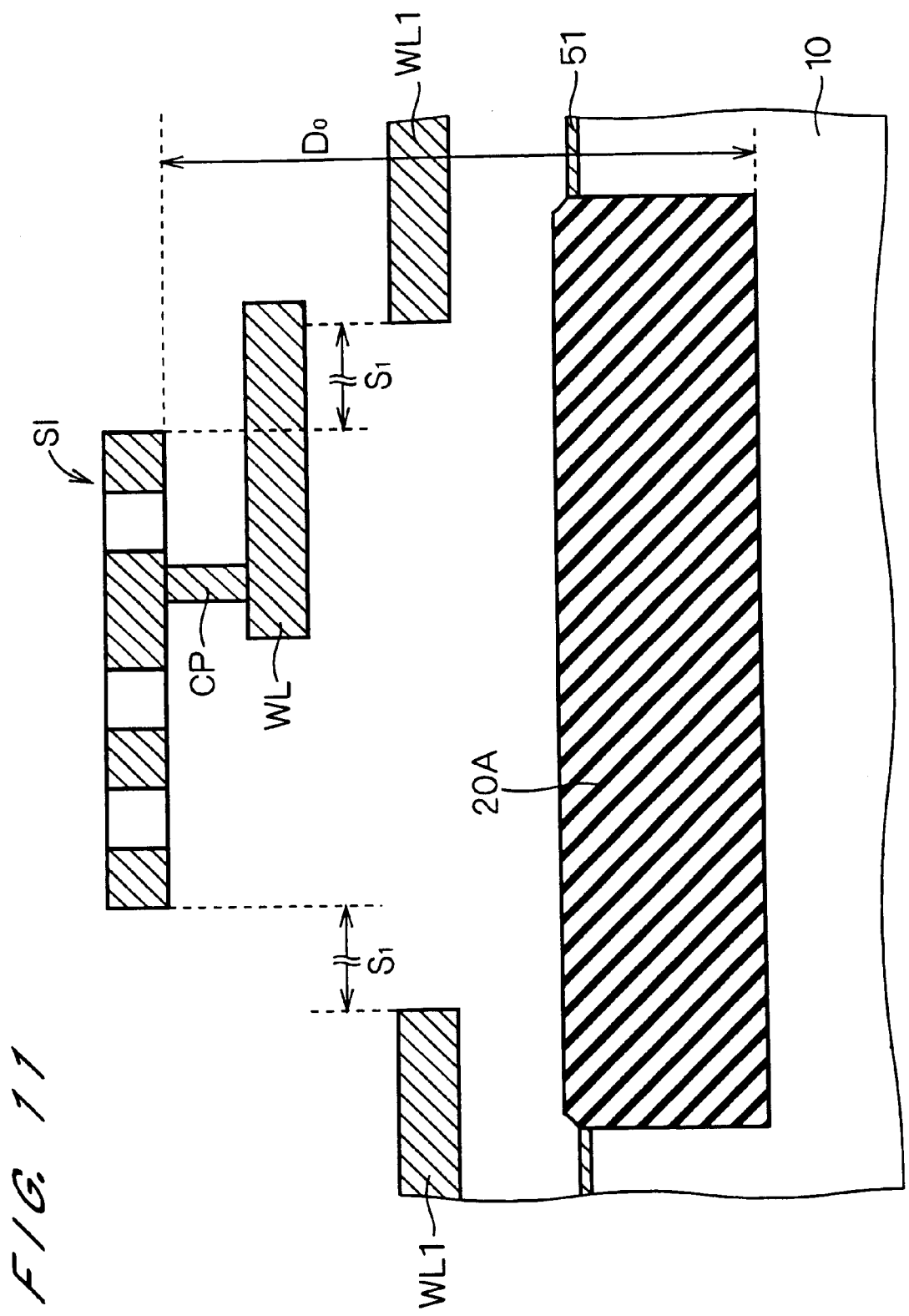
FIG. 11 is a cross-sectional view of the structure of a modification in the semiconductor device according to the second preferred embodiment of the present invention.

As illustrated in a semiconductor device 200A of FIG. 11, the trench isolation oxide film 20A may be provided in a larger area of the surface of the silicon substrate 10 than that corresponding to the area of the spiral inductor SI. Then, the wiring layer WL1 may be provided in an interlayer insulation film (not shown) on the trench isolation oxide film 20A so that the horizontal distance between each end surface of the wiring layer WL1 and the nearest end surface of the spiral inductor SI makes the distance $S_1$.

Here, it is needless to say that the distance $S_1$ is set to be not less than the distance $D_0$ ($S_1 \geq D_0$).

<B-3. Wiring Below Spiral Inductor>

In the aforementioned structures, the placement of layers to be conductors under the spiral inductor SI is avoided as much as possible. In practice, however, the spiral inductor SI is, as shown in FIG. 10, connected to the underlying wiring WL through the contact portion CP which passes through an interlayer insulation film not shown. Thus, at least the wiring WL exists under the spiral inductor SI.

In such a case, electrostatically induced power dissipation can be suppressed by locating connections between the wiring WL and other wiring formed in other layers outside the area defined by the aforementioned distance $S_1$. By so doing, an increase in electrostatically induced power dissipation, which will take place at the connections where two or more conductor layers overlaps one another, can be prevented.

Figure 12:
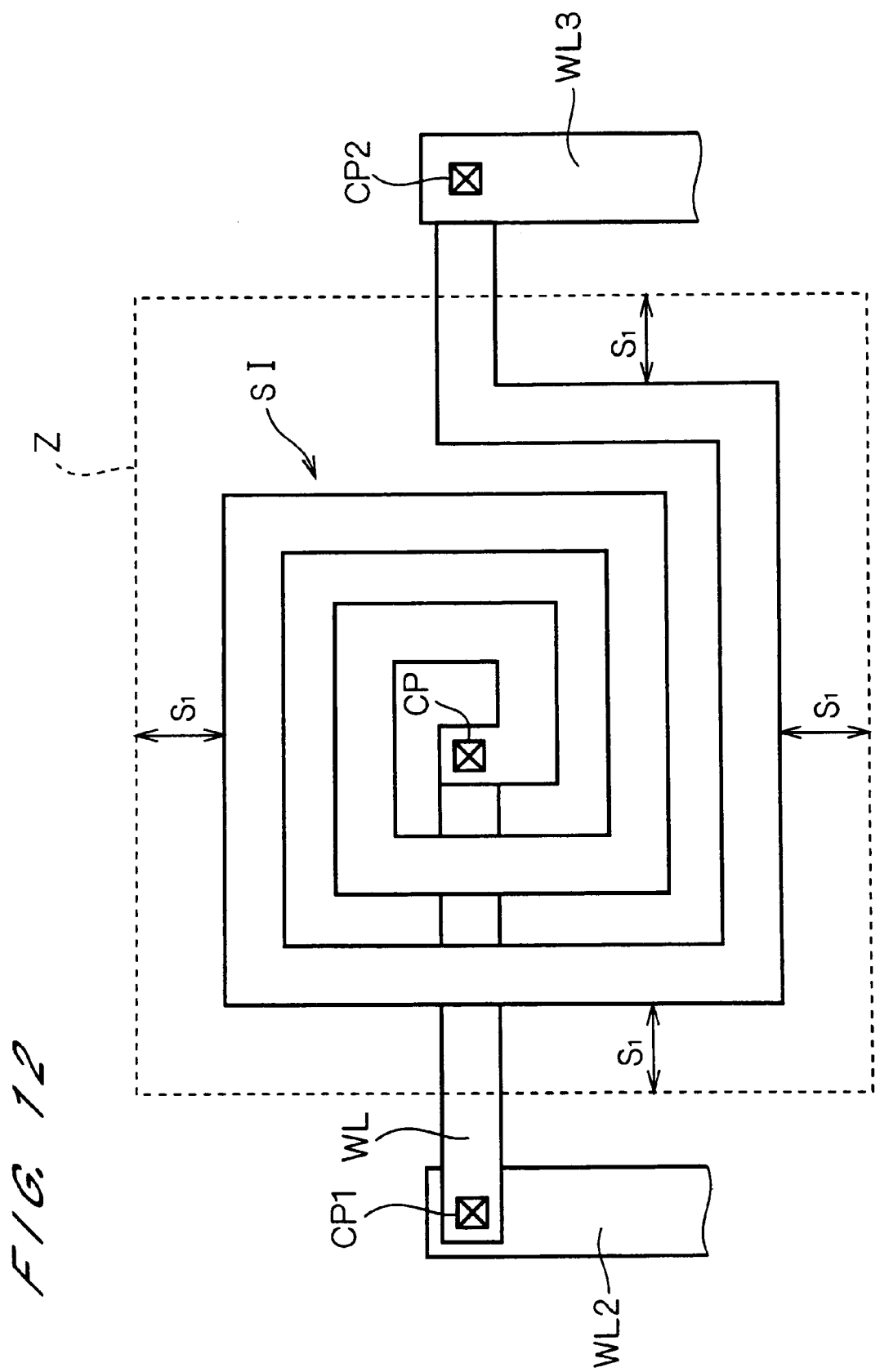
FIG. 12 is a plan view illustrating connections of wiring under a spiral inductor.

Such a structure is illustrated in FIG. 12. FIG. 12 is a plan view of the spiral inductor SI, wherein the dashed lines indicate the positions the distance $S_1$ away from four sides of the spiral inductor SI as a wiring layout boundary region Z.

As shown in FIG. 12, the wiring WL is provided so as to extend beyond the wiring layout boundary region Z and to be connected through a contact portion CP1 to wiring WL2 formed in a different layer.

The same applies to the other end of the spiral inductor SI. The other end of the spiral inductor SI extends beyond the wiring layout boundary region Z and is connected through a contact portion CP2 to wiring WL3 formed in a different layer.

<C. Third Preferred Embodiment>

<C-1. Device Structure>

In the structures of the first preferred embodiment according to the present invention, the trench isolation oxide film, which is provided in the surface of the semiconductor device under the spiral inductor, extends over a larger area that that corresponding to the area of the spiral inductor. However, forming the trench isolation oxide film over such a larger area is likely to cause dishing that the trench isolation oxide film is dished out.

In the formation of the trench isolation oxide film, after a trench is formed, an oxide film is embedded in the trench and unnecessary part of the oxide film is removed by CMP processing. At this time, a wide-area trench brings about too much removal of the oxide film therefrom, thereby causing dishing.

Figure 13:
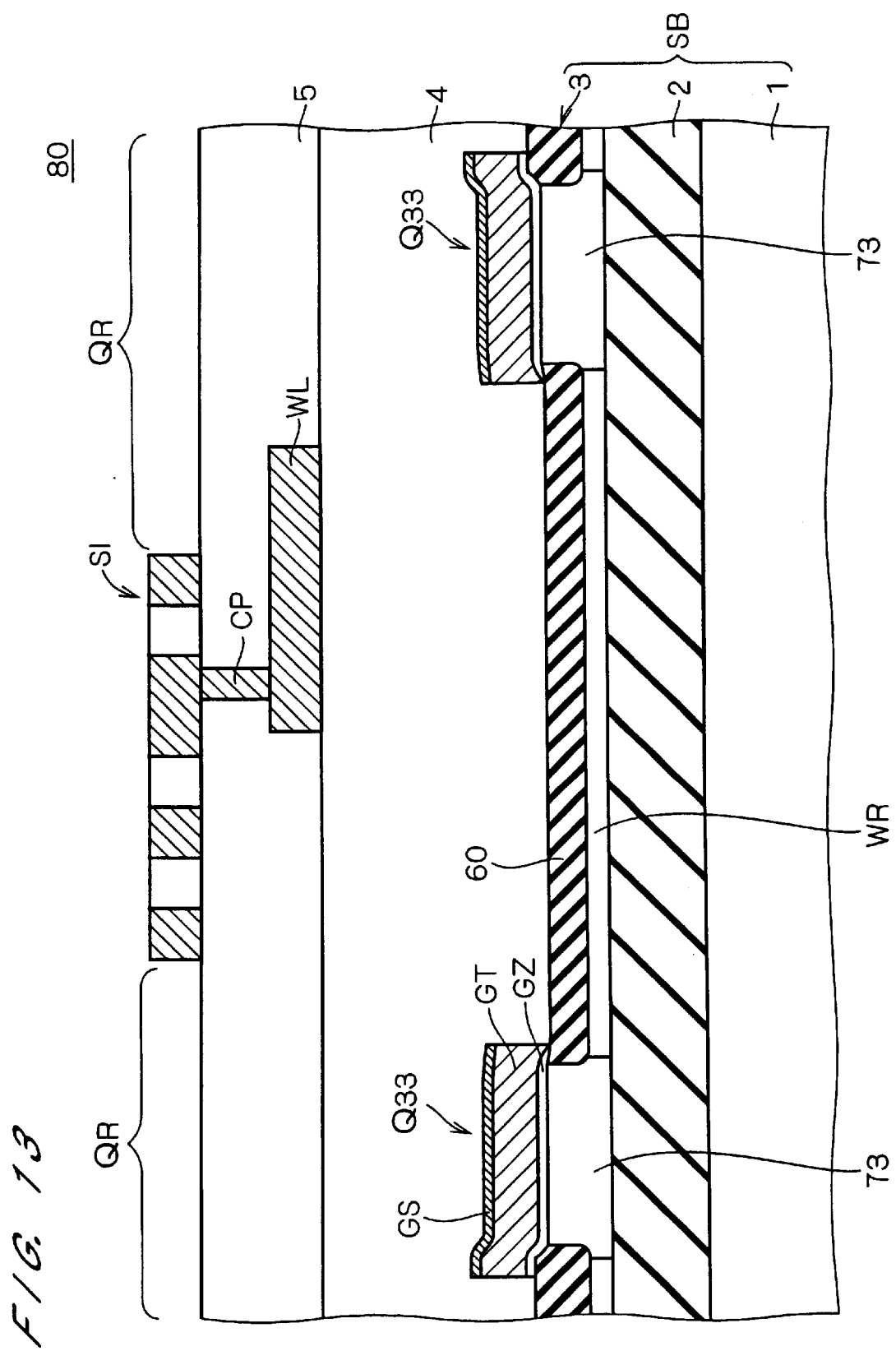
FIG. 13 is a cross-sectional view illustrating the effects of dishing in an isolation oxide film.

As one example of how the dishing occurs, FIG. 13 shows a structure of a semiconductor device 80. Referring to FIG. 13, in the SOI substrate SB comprised of the silicon substrate 1, the buried oxide film 2 provided on the silicon substrate 1 and the SOI layer 3 provided on the buried oxide film 2, a trench isolation oxide film 60 which is a partial isolation oxide film is provided in a wider area of the surface of the SOI layer 3 than that corresponding to the area of the spiral inductor SI.

There are MOS transistor formation regions QR, each with an SOI region 73, on both sides of the trench isolation oxide film 60. In each of the SOI region 73, an MOS transistor Q33 is formed.

The MOS transistors Q33 each comprise a gate insulation film GZ provided on the SOI region 73, a gate electrode GT provided on the gate insulation film GZ, and a silicide film GS provided on the gate electrode GT. Those MOS transistor 33 are of a common type with no special character in their structures and manufacturing method.

The interlayer insulation film 4, formed for example of a silicon oxide film, is provided to cover the whole surface of the SOI substrate SB, and the wiring WL is provided on the interlayer insulation film 4 to provide electrical connections between the spiral inductor SI and the MOS transistors Q33.

The interlayer insulation film 5, formed for example of a silicon oxide film, is. provided to cover the surface of the interlayer insulation film 4, and the spiral inductor SI is provided on the interlayer insulation film 5. One end of the spiral inductor SI is connected to the wiring WL through the contact portion CP which reaches the wiring WL through the interlayer insulation film 5.

In the semiconductor device 80 with such a structure, the surface of the trench isolation oxide film 60 is dished out. The upper edge portions of such a trench isolation oxide film 60, where the dishing occurs, are different in shape from those of normal trench isolation oxide films and may have the adverse effects of lowering the threshold value of the MOS transistors Q33 engaged with those upper edge portions, deteriorating the reliability of the gate insulation films GZ, and the like. There is also a possibility that source/drain impurities may be implanted into the channel formation region (body portion) through the thinned trench isolation oxide film 60, thereby causing instability in transistor operation.

Figure 14:
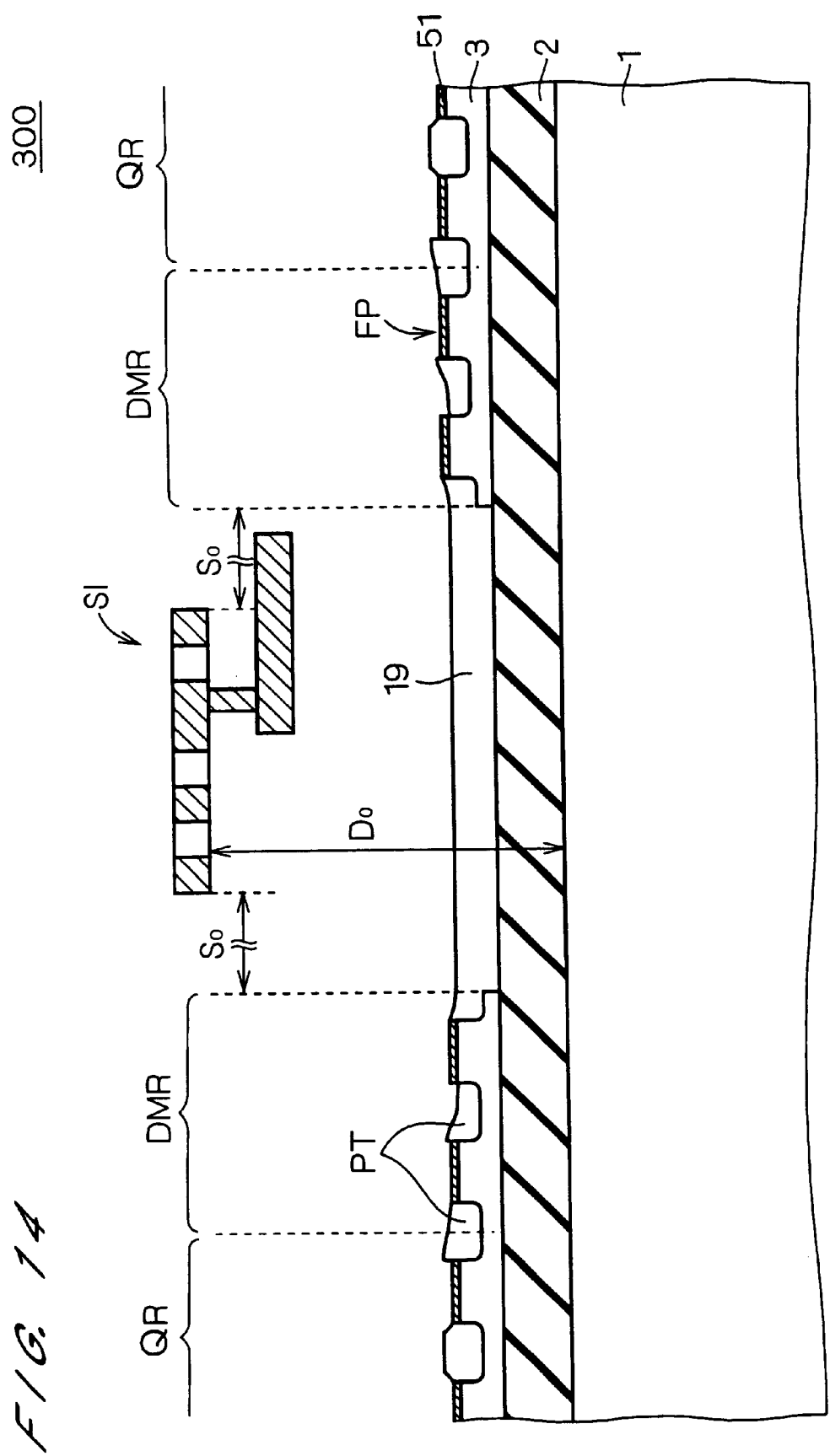
FIG. 14 is a cross-sectional view of the structure of a semiconductor device according to a third preferred embodiment of the present invention.

As a third preferred embodiment of the semiconductor device according to the present invention, FIG. 14 shows a structure of a semiconductor device 300 that will prevent dishing in the trench isolation oxide film which is provided over a large area. For the sake of simplicity, the spiral inductor SI and only the structure in the vicinity of the trench isolation oxide film 19, under the spiral inductor SI are shown in FIG. 14. The semiconductor device 300 is in all other aspects identical to the semiconductor device 80 illustrated in FIG. 13. The same reference numerals as in FIG. 13 designate like or corresponding parts and no mention is made here to avoid duplication.

Referring to FIG. 14, the trench isolation oxide film 19, which is a complete isolation oxide film including in part the structure of the partial isolation oxide film, is provided in a larger area of the surface of the SOI layer 3 than that corresponding to the area of the spiral inductor SI. The structure of the trench isolation oxide film 19, is illustrated in FIG. 3 and thus it is needless to say that electrostatically induced power dissipation and electromagnetically induced power dissipation can be reduced by setting the distance $S_0$ to be not less than the distance $D_0$ ($S_0 \geq D_0$).

The SOI layer 3 around the trench isolation oxide film 19, makes a dummy pattern region DMR of the trench isolation oxide film. In this dummy pattern region DMR, a plurality of partial isolation oxide films PT, each having a smaller area than the trench isolation oxide film 19, are provided to define field portions FP.

Dishing during CMP processing has the properties of noticeably occurring at and in the vicinity of wide-area field oxide films such as the trench isolation oxide film 19 and hardly occurring in field oxide films with small areas. Thus, the dummy pattern region DMR, including the partial isolation oxide films PT with small areas, is provided around the trench isolation oxide film 19. This prevents the extension of dishing to the MOS transistor formation regions QR and accordingly avoids deterioration in MOS transistor characteristics.

<C-2. Modification>

Figure 15:
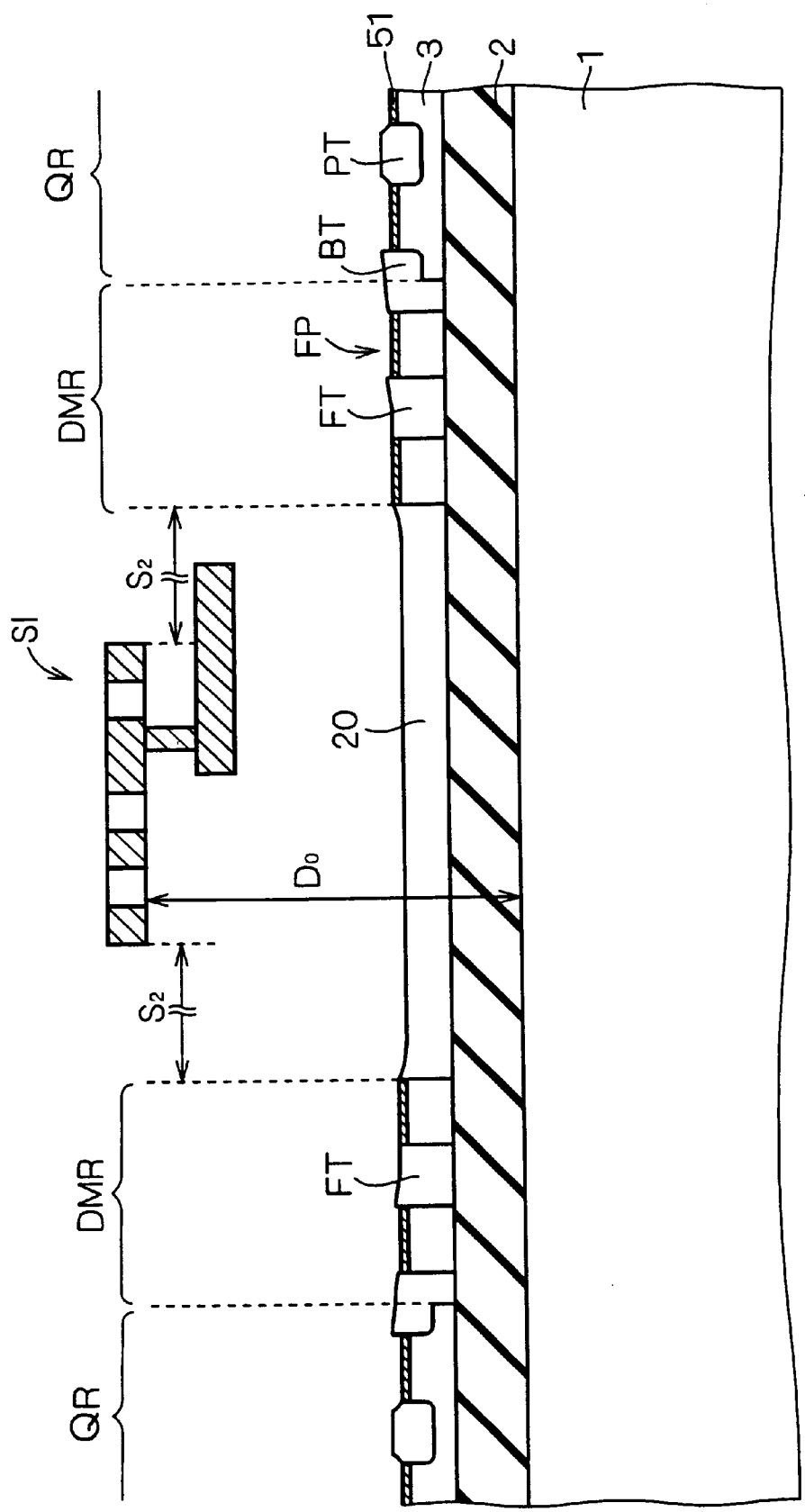
FIG. 15 is a cross-sectional view of the structure of a modification in the semiconductor device according to the third preferred embodiment.

The aforementioned semiconductor device 300 is so constructed that the trench isolation oxide film 19, which is a complete isolation oxide film including in part the structure of a partial isolation oxide film, is provided in a larger area of the surface of the SOI layer 3 than that corresponding to the area of the spiral inductor SI. This trench isolation oxide film 19, may be replaced with a trench isolation oxide film 20 which is a complete isolation oxide film as illustrated in a semiconductor device 300A of FIG. 15.

In this case, the trench isolation oxide film 20 is provided such that the horizontal distance between each end surface of the trench isolation oxide film 20 (i.e., the end surface of the SOI layer 3) and a corresponding end surface of the spiral inductor SI makes the distance $S_2$. The same reference numerals as in FIG. 14 designate like or corresponding parts and no mention is made here to avoid duplication.

By setting the distance $S_2$ to be not less than the distance $D_0$ ($S_2 \geq D_0$), the semiconductor device 300A, like the semiconductor device 100, can reduce electrostatically induced power dissipation and electromagnetically induced power dissipation at the edge portions of the SOI layer 3.

The SOI layer 3 around the trench isolation oxide film 20 makes the dummy pattern region DMR of the trench isolation oxide film. In this dummy pattern region DMR, a plurality of complete isolation oxide films FT, each having a smaller area than the trench isolation oxide film 19, are provided to define the field portions FP.

Further, a combination isolation oxide film BT which is a combination of a complete isolation oxide film and a partial isolation oxide film is provided in the interface surface between the dummy pattern region DMR and each of the MOS transistor formation regions QR. In the MOS transistor formation regions QR, partial isolation oxide films PT are provided.

In this fashion, the dummy pattern region DMR, including the complete isolation oxide films FT with small areas and the combination isolation oxide film BT, is provided around the trench isolation oxide film 20. This prevents the extension of dishing to the MOS transistor formation regions QR and accordingly avoids deterioration in MOS transistor characteristics.

<C-3. Area of Dummy Pattern Region>

Now, the area of the dummy pattern region DMR will be described with reference to FIG. 16.

Figure 16:
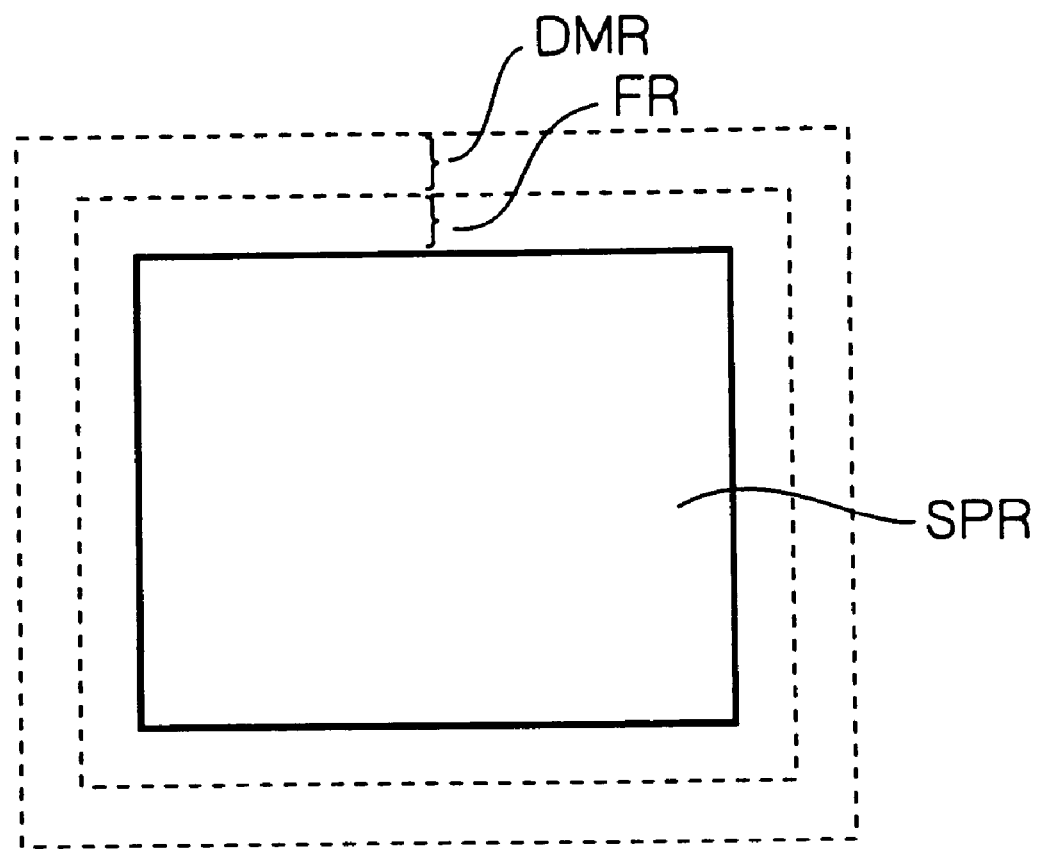
FIG. 16 is a plan view illustrating the location of a dummy pattern region.

FIG. 16 is a plan view schematically showing the layout of the dummy pattern region DMR, wherein the area of the spiral inductor SI is presented as a rectangular inductor region SPR which is surrounded by a complete isolation region FR of the trench isolation oxide film 19, or 20. It goes without saying that the space between the solid line defining the inductor region SPR and the dashed line defining the complete isolation region FR is either the aforementioned distance $S_0$ or $S_2$.

Further, the dummy pattern region DMR is provided to surround the complete isolation region FR.

The dummy pattern region DMR should preferably be set to have a width 5% or more of the length of one short side of the complete isolation region FR. This is because the experiments by the inventors and the like had proved that the degree of dishing during CMP processing depended on the length of short sides of a wide-area field oxide film such as the trench isolation oxide film 19, or 20 and that dishing would extend over 5% or more of such a length of short sides beyond the outer edge of the trench isolation oxide film.

Thus, by setting the dummy pattern region DMR to have the width 5% or more of the length of the short sides of the complete isolation region FR, the extension of dishing to the MOS transistor formation regions QR can be prevented.

<C-4. Form of Location of Dummy Pattern Region>

Figure 17:
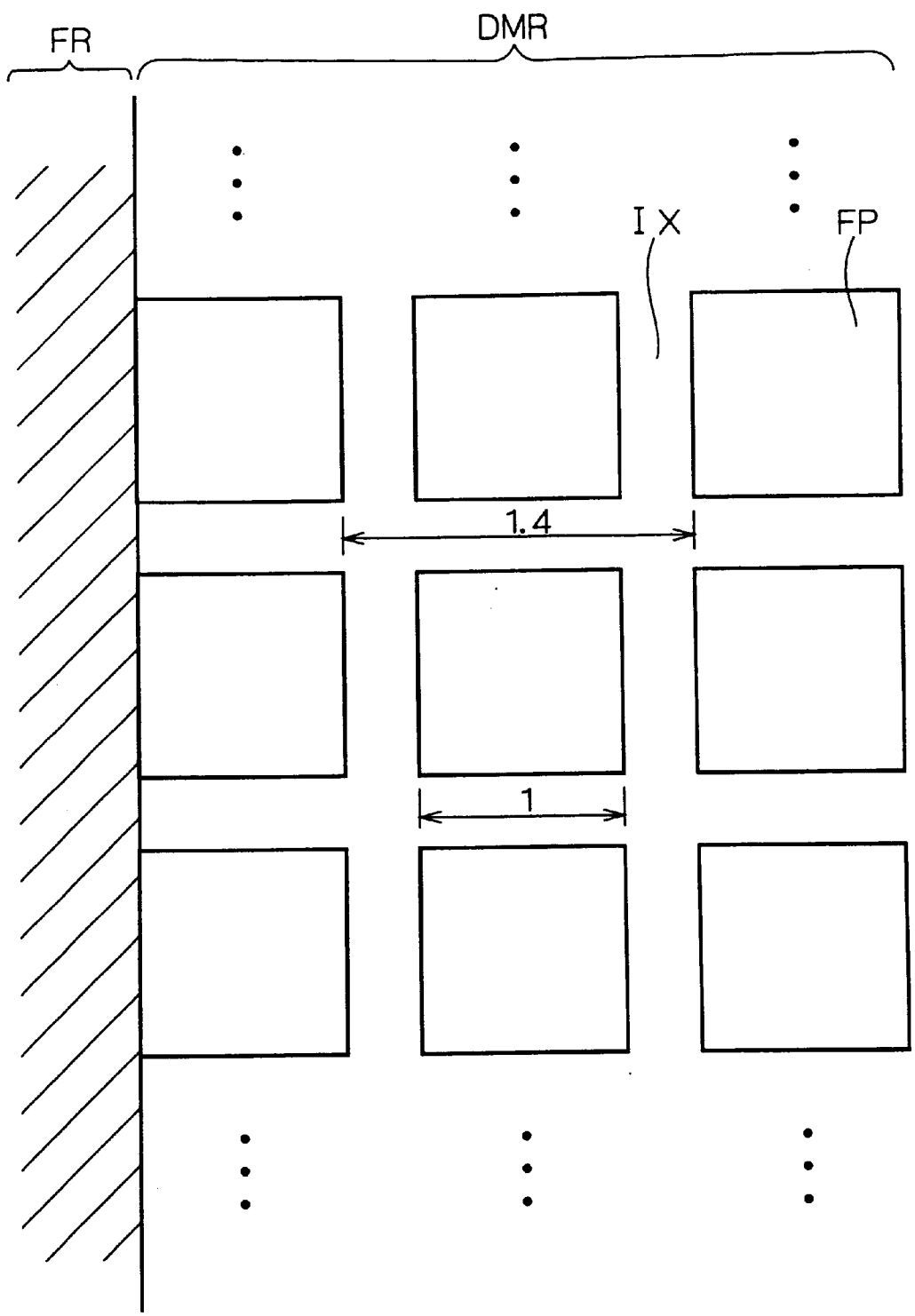
FIG. 17 is a plan view illustrating the shape of the dummy pattern region.

Referring now to FIG. 17, one form of location of the dummy pattern region DMR will be described.

FIG. 17 is a plan view showing part of the complete isolation region FR and the dummy pattern region DMR illustrated in FIG. 16, wherein the shapes of the field portions FP in the dummy pattern region DMR are illustrated as squares in the paper plane.

The field portions FP should preferably be provided such that the area ratio of the field portions FP to an isolation oxide film (including the complete isolation oxide films PT, the partial isolation oxide films FT, and the like) IX therearound becomes approximately 1:1.

When the length of one side of the field portions FP is taken as 1, the area ratio of the field portions FP to the isolation oxide film IX therearound can be made approximately 1:1 by setting the length of one side of the isolation oxide film IX to be 1.4.

<D. Fourth Preferred Embodiment>

In the structures of the first to third preferred embodiments according to the present invention, the trench isolation oxide film, which is provided in the surface of the semiconductor substrate under the spiral inductor, extends over a larger range than that corresponding to the area of the spiral inductor. Not only that trench isolation oxide film under the spiral inductor but also other trench isolation oxide films to be provided in the surface of the semiconductor device under a capacitor and a resistive element may be of the same configuration. Also in such cases, a parasitic capacitance component and thereby electrostatically induced power dissipation can be reduced.

Figure 18:
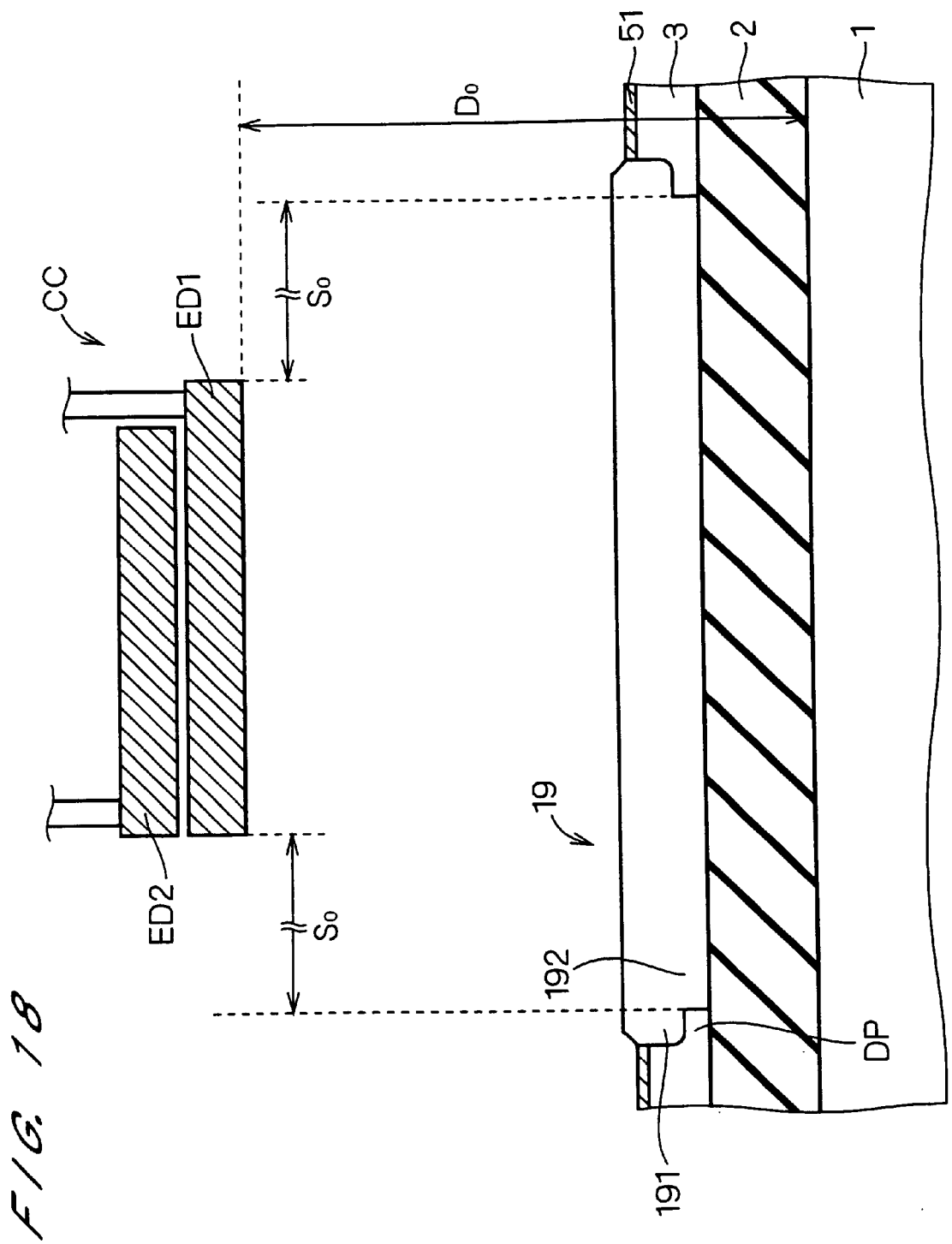
FIG. 18 is a cross-sectional view of the structure of a semiconductor device according to a fourth preferred embodiment of the present invention.

FIG. 18 for example shows the case where the spiral inductor SI in the semiconductor device 100 of FIG. 3 is replaced with a capacitor CC, under which the trench-isolation oxide film 19, is provided.

The capacitor CC with a common structure comprises two electrodes ED1 and ED2 which are connected to different wiring layers (not shown).

In FIG. 18, the horizontal distance between an end surface of each protrusion DP of the SOI layer 3 and a corresponding end surface of the electrode ED1 of the capacitor CC is indicated by the distance $S_0$, and a distance between the lower surface of the electrode ED1 of the capacitor CC and the upper main surface of the silicon substrate 1 is indicated by the distance $D_0$.

Electrostatically induced power dissipation can be reduced by setting the distance $S_0$ to be not less than the distance $D_0$ ($S_0 \geq D_0$).

Figure 19:
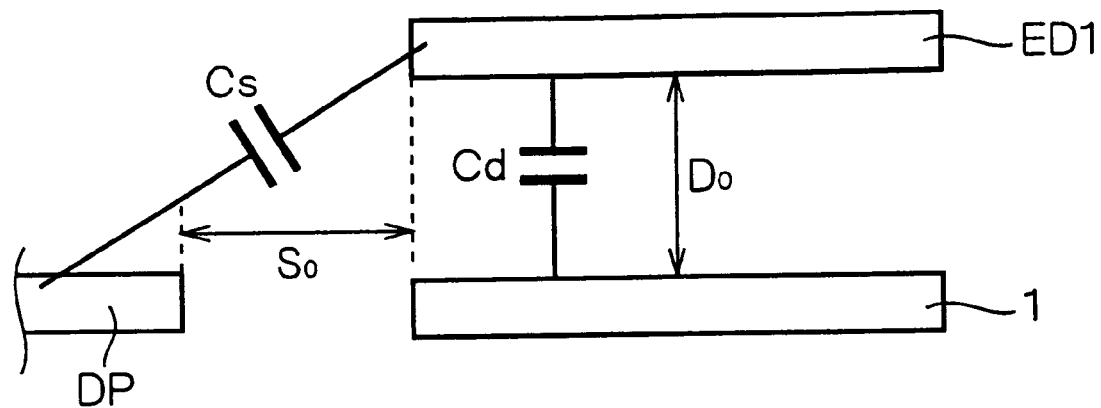
FIG. 19 is a schematic diagram illustrating how to reduce parasitic capacitance.

Now, the reduction in electromagnetically induced power dissipation will be described with reference to FIG. 19. When the silicon substrate 1 opposed to the electrode ED1 of the capacitor CC is taken as a virtual electrode 1 in FIG. 19, parasitic capacitance $C_d$ is generated with an insulating material between the electrode ED1 and the virtual electrode 1 as a derivative. The parasitic capacitance $C_d$ can be expressed by the following equation (1):

$$C_d \propto \varepsilon \frac{1}{D_0} \quad (1)$$

where $\varepsilon$ is the permittivity of the dielectric.

On the other hand, when one protrusion DP of the SOI layer 3 is taken as an electrode against the electrode ED1 of the capacitor CC, parasitic capacitance $C_S$ is created with an insulating material between the protrusion DP and the electrode ED1 of the capacitor CC as a dielectric. In this case, a linear distance between the protrusion DP of the SOI layer 3 and the electrode ED1 of the capacitor CC can be expressed by the square root of $S_0^2 + D_0^2$ and the parasitic capacitance $C_S$ can be expressed by the following equation (2):

$$C_s \propto \varepsilon \frac{1}{\sqrt{S_0^2 + D_0^2}} \quad (2)$$

For the distance $S_0$ of 0 (i.e., with a conventional structure), the parasitic capacitance $C_S$ is equal to the parasitic capacitance $C_d$; therefore, the total parasitic capacitance is twice as much as the parasitic capacitance $C_d$. In the present invention, the distance $S_0$ is not less than the distance $D_0$. Thus, when $S_0 = D_0$ for example, the parasitic capacitance $C_S$ can be expressed by the following equation (3):

$$C_s \propto \varepsilon \frac{1}{D_0 \sqrt{2}} \quad (3)$$

As can be seen from the equation (3), the parasitic capacitance $C_S$ equals $1/\sqrt{2}$ of the parasitic capacitance $C_d$. The parasitic capacitance can thus be smaller than that in conventional cases, which results in a reduction in electrostatically induced power dissipation.

This mechanism also applies to the first to third preferred embodiments.

Figure 20:
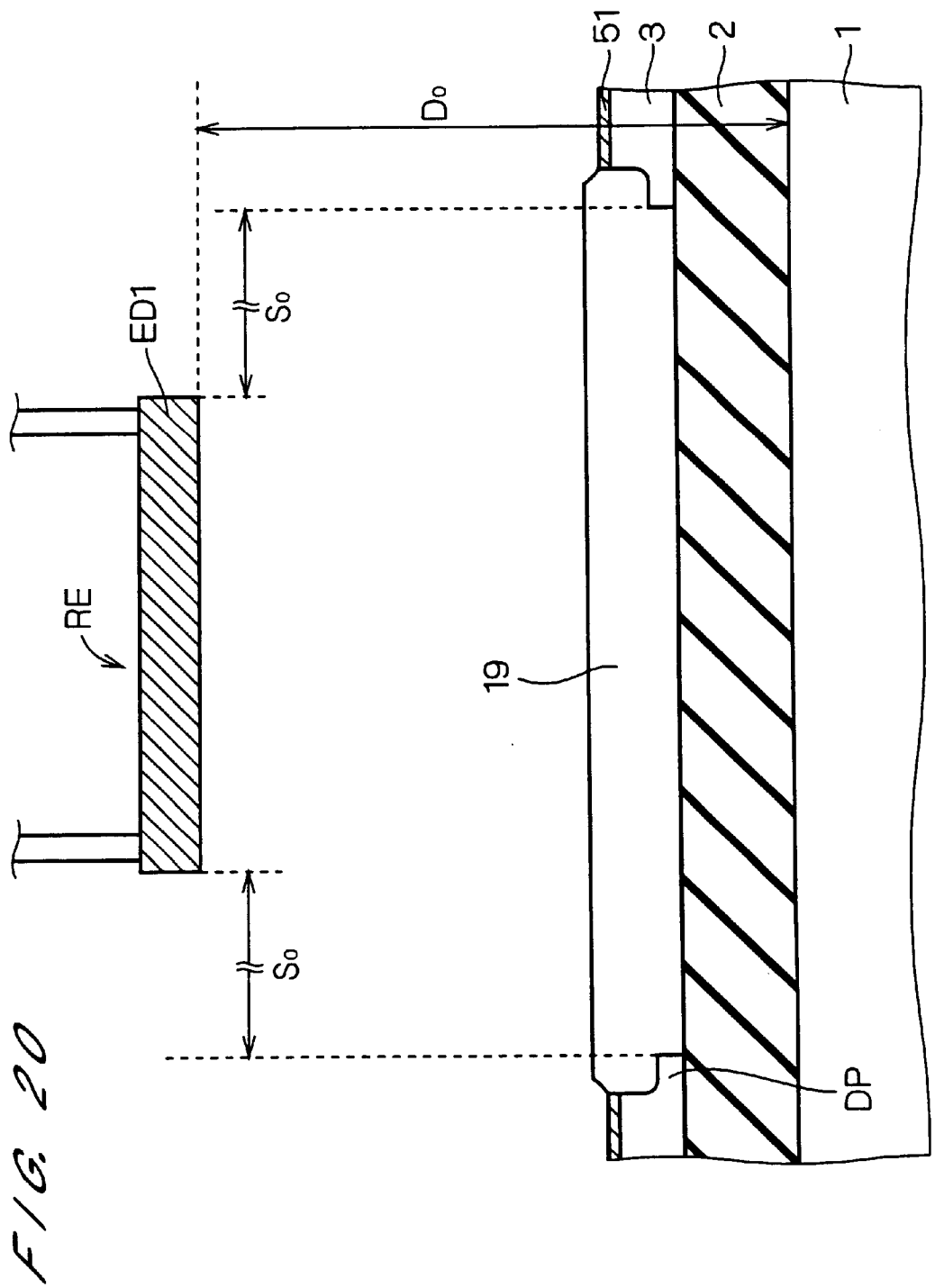
FIG. 20 is a cross-sectional view of the structure of the semiconductor device according to the fourth preferred embodiment of the present invention.

FIG. 20 shows the case where the spiral inductor SI in the semiconductor device 100 of FIG. 3 is replaced with a resistive element RE, under which the trench isolation oxide film 19, is provided.

The resistive element RE with a common structure has its two ends connected to different wiring layers (not shown).

In FIG. 20, a horizontal distance between the end surface of each protrusion DP of the SOI layer 3 and a corresponding end surface of the resistive element RE is indicated by the distance $S_0$, and a distance between the lower surface of the resistive element RE and the upper main surface of the silicon substrate 1 is indicated by the distance $D_0$.

As have been described, electrostatically induced power dissipation can be reduced by setting the distance $S_0$ to be not less than the distance $D_0$ ($S_0 \geq D_0$).

Further as in the third preferred embodiment, it goes without saying that the extension of dishing to the MOS transistor formation regions and thereby deterioration in MOS transistor characteristics can be prevented by providing the dummy pattern region around the trench isolation oxide film 19.

<E. Forms of Element Isolation with Various Trench Isolation Oxide Films>

Figure 27:
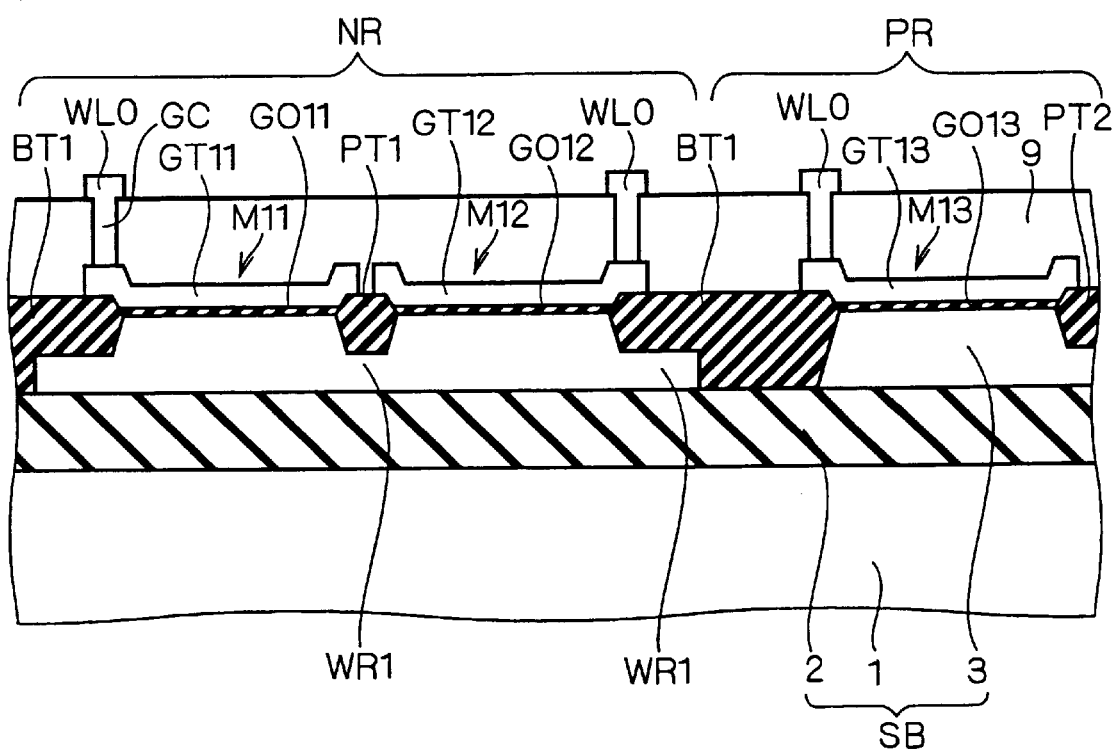
FIG. 27 is a cross-sectional view of another form of element isolation with a trench isolation oxide film.

In the foregoing description, the trench isolation oxide film as a complete isolation oxide film including in part the structure of a partial isolation oxide film is illustrated in FIG. 2; and the combination isolation oxide film BT which is a combination of a complete isolation oxide film and a partial isolation oxide film is illustrated in FIG. 27. Now, one example of the configuration of element isolation and its manufacturing method using the above trench isolation oxide films will be described.

<E-1. First Form>

Figure 21:
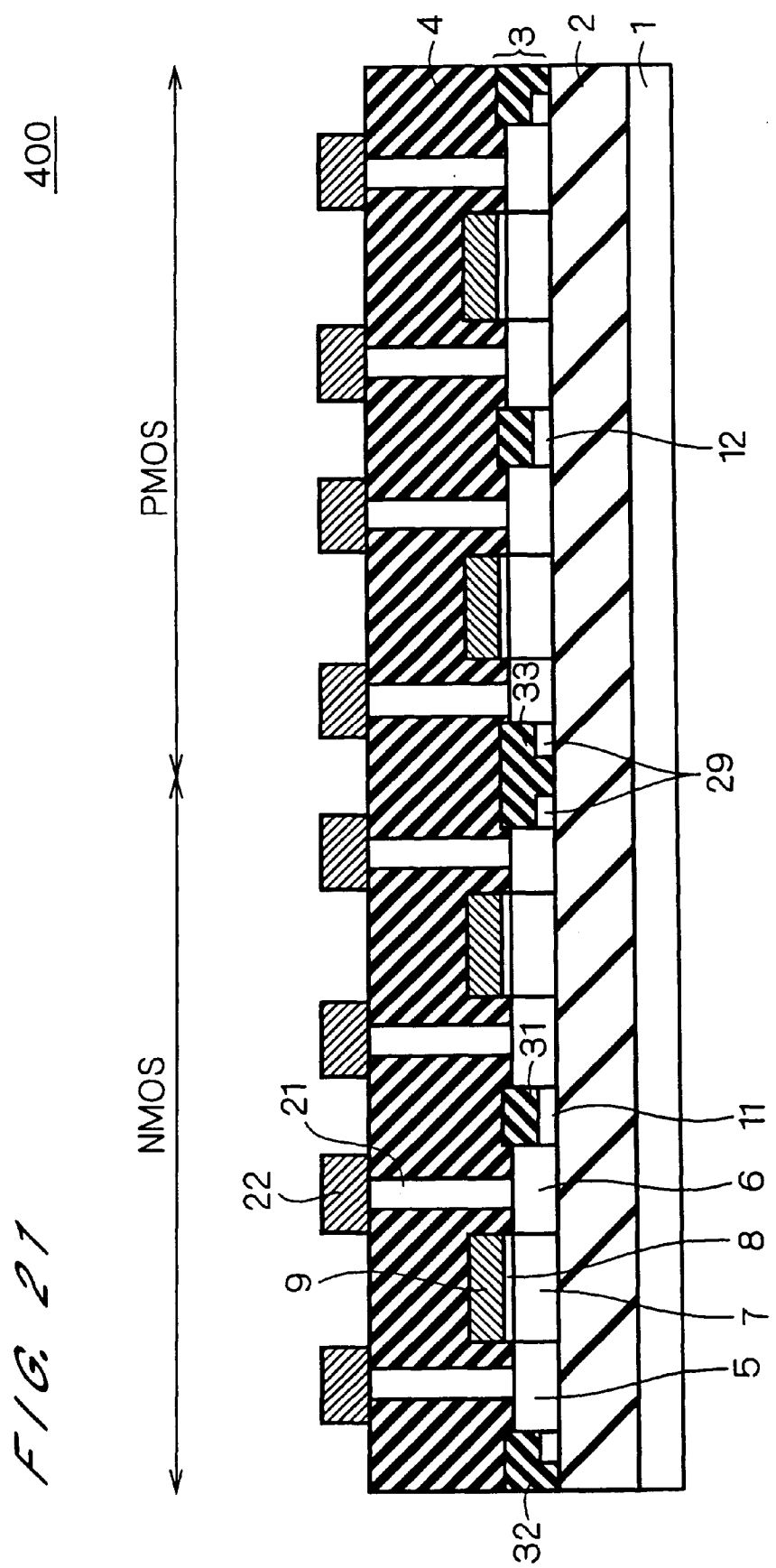
FIG. 21 is a cross-sectional view of one form of element isolation with a trench isolation oxide film.

FIG. 21 shows the structure of a semiconductor device 400 that provides element isolation with a complete isolation oxide film including in part the structure of a partial isolation oxide film. A trench isolation oxide film 33 illustrated therein corresponds to the trench isolation oxide film 19, described in the first preferred embodiment.

Referring to FIG. 21, in the semiconductor device having the SOI structure comprised of the silicon substrate 1, the buried oxide film 2, and the SOI layer 3, each transistor formation region in the SOI layer 3 is divided by a partial isolation oxide film 13 with a well region formed thereunder. A p-type well region 11 is formed under the partial isolation oxide film 13 which provides isolation between NMOS transistors, and an n-type well region 12 is formed under the partial isolation oxide film 13 which provides isolation between PMOS transistors. Isolation between the PMOS transistors and the NMOS transistors is achieved by the trench isolation oxide film 33. The trench isolation oxide film 33 has well regions 29 in part of the lower portion but in most parts extends from the top to the bottom surfaces of the SOI layer 3 to provide complete isolation between the PMOS transistors and the NMOS transistors.

The well 11 is formed to surround drain and source regions 5 and 6 of the NMOS transistor group, and the well 12 is formed to surround drain and source regions 5 and 6 of the PMOS transistor group. The surface of the SOI layer 3 is covered with the interlayer insulation film 4.

A single MOS transistor isolated from others by the partial isolation oxide film 13 comprises the drain region 5, the source region 6, a channel formation region 7, those regions 5, 6, 7 being formed in the SOI layer 3, a gate oxide film 8 formed on the channel formation region 7, and a gate electrode 9 formed on the gate oxide film 8. A wiring layer 22 formed on the interlayer insulation film 4 is electrically connected to the drain or source region 5, 6 through a contact 21 formed in the interlayer insulation film 4.

Referring now to FIGS. 22 through 26, the element isolation process in the semiconductor device 400 will be described.

Figure 22:
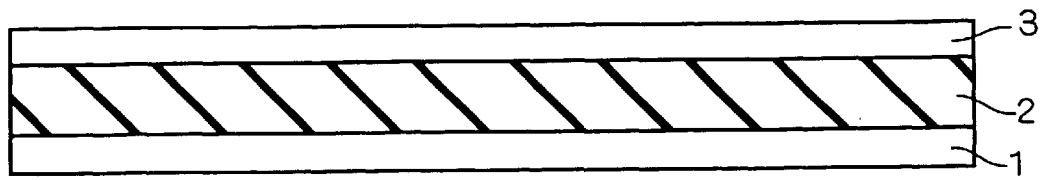
FIGS. 22 through 26 are cross-sectional views of a method of manufacturing one form of element isolation with the trench isolation oxide film.

First, the SOI substrate SB comprised of the silicon substrate 1, the buried oxide film 2, and the SOI layer 3 is prepared as shown in FIG. 22. Normally, the SOI layer 3 has a thickness of 50 to 200 nm, and the buried oxide film 2 has a thickness of 100 to 400 nm.

The SOI substrate SB may be formed by any method such as the SIMOX method to form the buried oxide film 2 by oxygen ion implantation, the wafer bonding method, or the like. The present invention imposes no limitations upon the method of manufacturing the SOI substrate SB.

Figure 23:
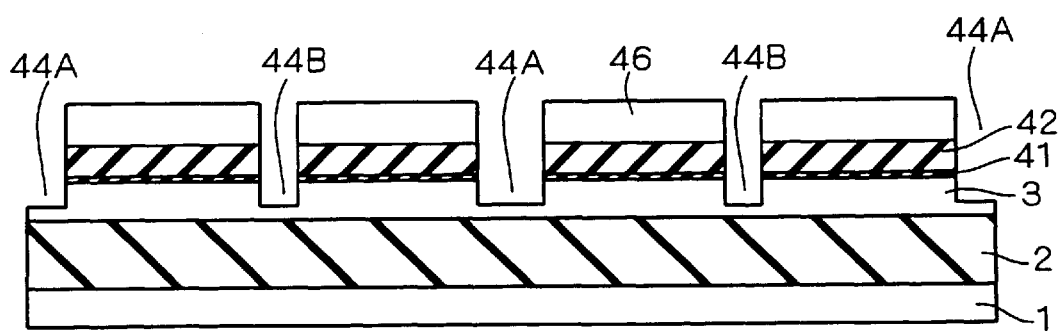

Then, an oxide film 41 having a thickness of about 20 nm and a nitride film 42 having a thickness of about 200 nm are deposited on the SOI substrate 3 in that order. A subsequent patterning of the isolation region using a patterned resist 43 as a mask etches a three-layer film comprised of the nitride film 42, the oxide film 41 and the SOI layer 3 so that the lower portion of the SOI layer 3 is left. This provides relatively wide partial trenches 44A and relatively narrow partial trenches 44B as shown in FIG. 23.

The partial trenches 44A are used for complete isolation and the partial trenches 44B for partial isolation. The partial trenches 44A and 44B are formed so that the lower portion of the SOI layer 3 is left.

Figure 24:
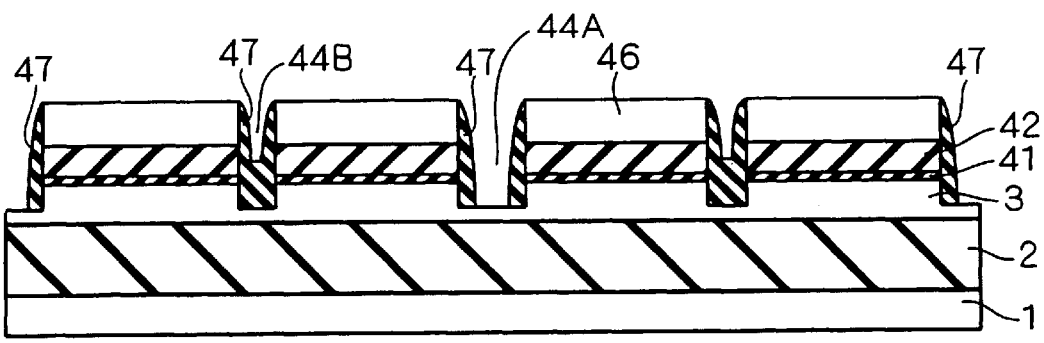

Then as shown in FIG. 24, oxide films 47 are formed as sidewalls on the side surfaces of the partial trenches 44A and 44B so that the bottom surfaces of the partial trenches 44B are covered with those sidewalls but the bottom center portions of the partial trenches 44A are exposed. This utilizes the fact that the width of the partial trenches 44B is less than that of the partial trenches 44A.

Figure 25:
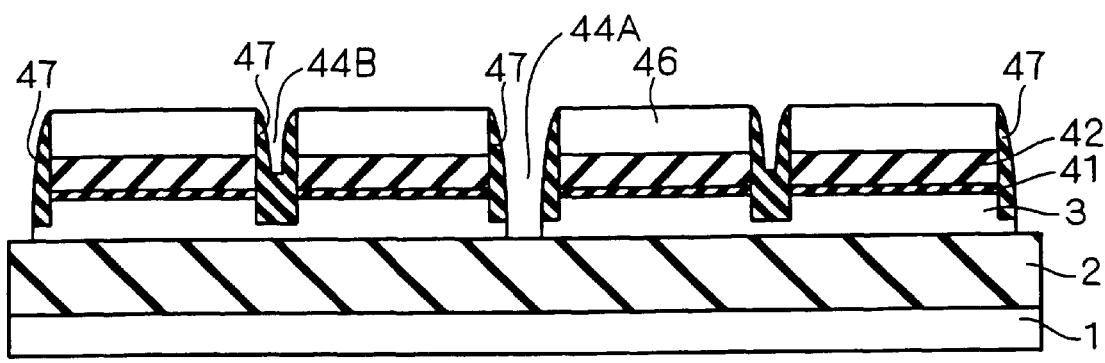

Using the oxide films 47 as masks, silicon etching is performed on the SOI layer 3 as shown in FIG. 25. Accordingly, part of the SOI layer 3 which is not covered with the oxide films 47, including the portions under the bottom center portions of the partial trenches 44A, is removed and part of the surface of the buried oxide film 2 is exposed.

Figure 26:
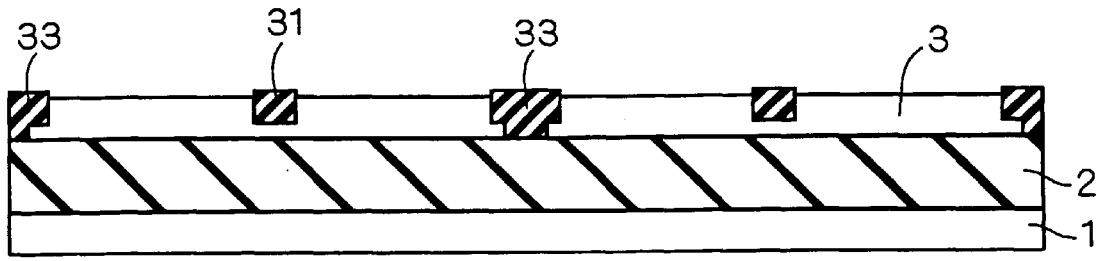

After an oxide film having a thickness of about 500 nm is deposited, polishing is performed through CMP processing in a similar manner to the conventional trench isolation so that the nitride film 42 is removed partway. Then, the nitride film 42 and the oxide film 41 are removed to obtain the structure as shown in FIG. 26, wherein the partial isolation oxide films 13 (and the SOI layer 3 thereunder) and the trench isolation oxide-films 33 (and the SOI layer 3 under part thereof) are selectively formed.

Thereafter, NMOS transistors and PMOS transistors are formed in the NMOS transistor formation region and the PMOS transistor formation region, respectively, by the existing method. This completes the semiconductor device 400 shown in FIG. 7.

<E-2. Second Form>

FIG. 27 shows the structure of a semiconductor device 500 that provides element isolation with a combination isolation oxide film which is a combination of a complete isolation oxide film and a partial isolation oxide film. A combination isolation oxide film BT1 illustrated therein corresponds to the combination isolation oxide film BT described as one modification in the third preferred embodiment.

As shown in FIG. 27, the semiconductor device 500 is formed on the SOI substrate SB with the buried oxide film 2 and the SOI layer 3 provided on the silicon substrate 1. The device 50 has a region NR to form NMOS transistors and a region PR to form a PMOS transistor, between which there is the combination isolation oxide film BT1 which is a combination of a complete isolation oxide film and a partial isolation oxide film.

The sectional shape of the combination isolation oxide film BT1 is such that the portion on the region PR side reaches the buried oxide film 2 through the SOI layer 3 while the portion on the region NR side has a p-type well region WR1 thereunder.

On the SOI layer 3 in the region NR, two NMOS transistors M11 and M12 are provided and isolated from each other by a partial isolation oxide film PT1 with the well region WR1 provided thereunder.

The NMOS transistor M11 provided on the left side of the partial isolation oxide film PT1 on the SOI layer 3 comprises a gate oxide film GO11 extending between the partial isolation oxide film PT1 and another combination isolation oxide film BT1, and a gate electrode GT11 provided on the gate oxide film GO11 with its ends engaged on top of the partial isolation oxide film PT1 and the other combination isolation oxide film BT1.

The NMOS transistor M12 provided on the right side of the partial isolation oxide film PT1 on the SOI layer 3 comprises a gate oxide film GO12 extending between the partial isolation oxide film PT1 and the combination isolation oxide film BT1, and a gate electrode GT12 provided on the gate oxide film GO12 with its ends engaged on top of the partial isolation oxide film PT1 and the combination isolation oxide film BT1.

Further, a partial isolation oxide film PT2 is provided in the SOI layer 3 in the region PR, and a PMOS transistor M13 is provided on the SOI layer 3 between the partial isolation oxide film PT2 and the combination isolation oxide film BT1.

The PMOS transistor M13 comprises a gate oxide film GO13 extending between the partial isolation oxide film PT2 and the combination isolation oxide film BT1, and a gate electrode GT13 provided on the gate oxide film GO13 with its ends engaged on top of the partial isolation oxide film PT2 and the combination isolation oxide film BT1.

Then, an interlayer insulation film 9 is provided across the surface of SOI substrate SB, and a plurality of gate contacts GC are provided each to reach one end of any of the gate electrodes GT11, GT12 and GT13 through the interlayer insulation film 9. The gate contacts GS are connected to wiring layers WL0 patterned on the interlayer insulation film 9.

Referring now to FIGS. 28 through 34, the element isolation process in the semiconductor device 500 will be described.

Figure 28:
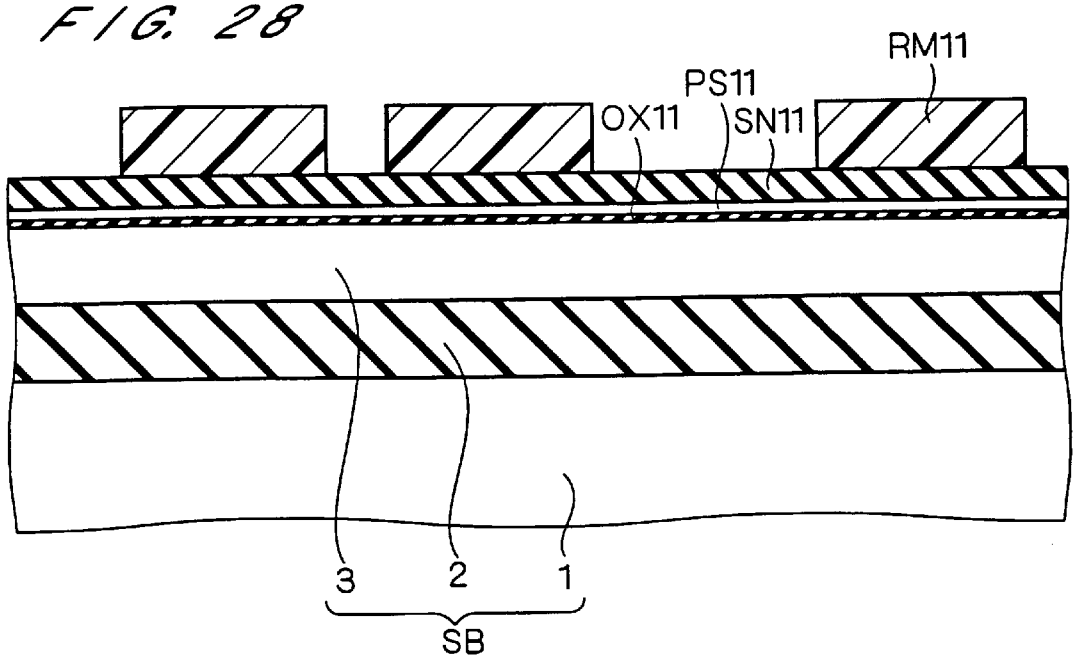
FIGS. 28 through 34 are cross-sectional view of a method of manufacturing another form of element isolation with the trench isolation oxide film.

First, the SOI substrate SB with the buried oxide film 2 and the SOI layer 3 provided on the silicon substrate 1 is prepared as shown in FIG. 28. The SOI substrate SB may be formed by any method such as the SIMOX method, the wafer bonding method, or the like. Normally, the SOI layer 3 has a thickness of 50 to 200 nm, and the buried oxide film 2 has a thickness of 100 to 400 nm.

An oxide film (oxide extension layer) OX11 of about 5 to 50 nm (50 to 500 Å) in thickness is formed on the SOI layer 3 by CVD under a temperature condition of about 800° C. Alternatively, the oxide film OX11 may be formed by thermal oxidization of the SOI layer 3 under a temperature condition of about 800 to 1000° C.

Then, a polysilicon layer (oxide extension layer) PS11 of about 10 to 100 nm (100 to 1000 Å) in thickness is formed on the oxide film OX11 by CVD.

Further, a nitride film SN11 of about 50 to 200 nm (500 to 2000 Å) in thickness is formed on the polysilicon layer PS11 by CVD under a temperature condition of about 700° C. The nitride film may be replaced with an oxynitride film which is formed in a mixed atmosphere of nitrogen and oxygen to contain several to several tens percent nitrogen.

Following this, a resist mask RM11 is formed on the nitride film SN11 by patterning. The resist mask RM11 has such a pattern that openings are formed in portions corresponding to the locations of the partial isolation oxide films PT1 and PT2 and the combination isolation oxide film BT1 (FIG. 1).

Figure 29:
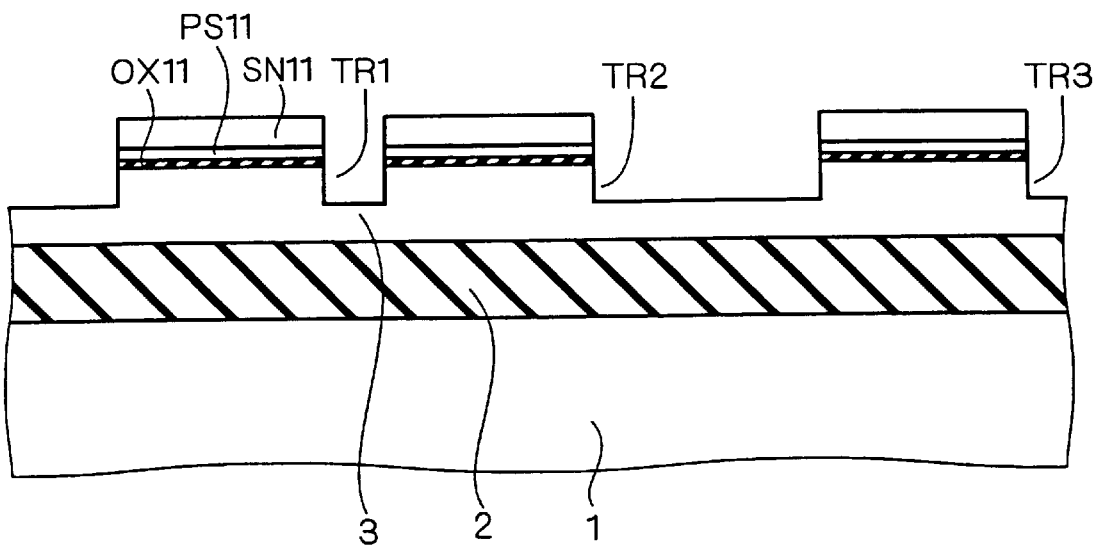

In the step shown in FIG. 29, the nitride film SN11 is etched according to the opening pattern of the resist mask RM11. With the etched nitride film SN11 as an etching mask, the polysilicon layer PS11, the oxide film OX11, and the SOI layer 3 are selectively removed by dry etching, to thereby form trenches TR1, TR2 and TR3 in positions corresponding to those of the partial isolation oxide films PT1 and PT2 and the combination isolation oxide film BT1.

The etching process on the SOI layer 3 must not proceed to the extent that the surface of the buried oxide film 2 is exposed. Further, crystal defects will occur if the SOI layer 3 between the bottoms of the trenches TR1 to TR3 and the surface of the buried oxide film 2 is excessively thin. Thus, the etching condition should be set that the etched SOI layer 3 has a thickness of at least about 10 nm.

Figure 30:
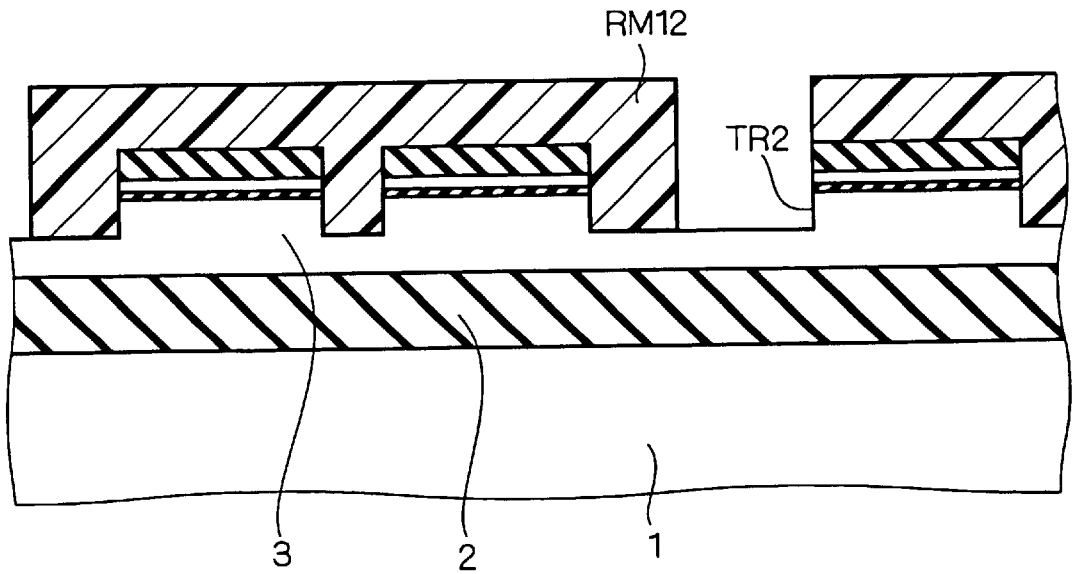

In the step shown in FIG. 30, a resist mask RM12 is formed by patterning. The resist mask RM12 has such a pattern that only a predetermined portion of the trench TR2 makes an opening. More specifically, the pattern of the resist mask RM12 is such that only an area of the to-be-formed combination isolation oxide film BT1 (FIG. 27) which reaches the buried oxide film 2 through the SOI layer 3 makes an opening. The trench TR2 is then etched according to the opening pattern of the resist mask RM12, whereby the buried oxide film 2 is exposed.

Figure 31:
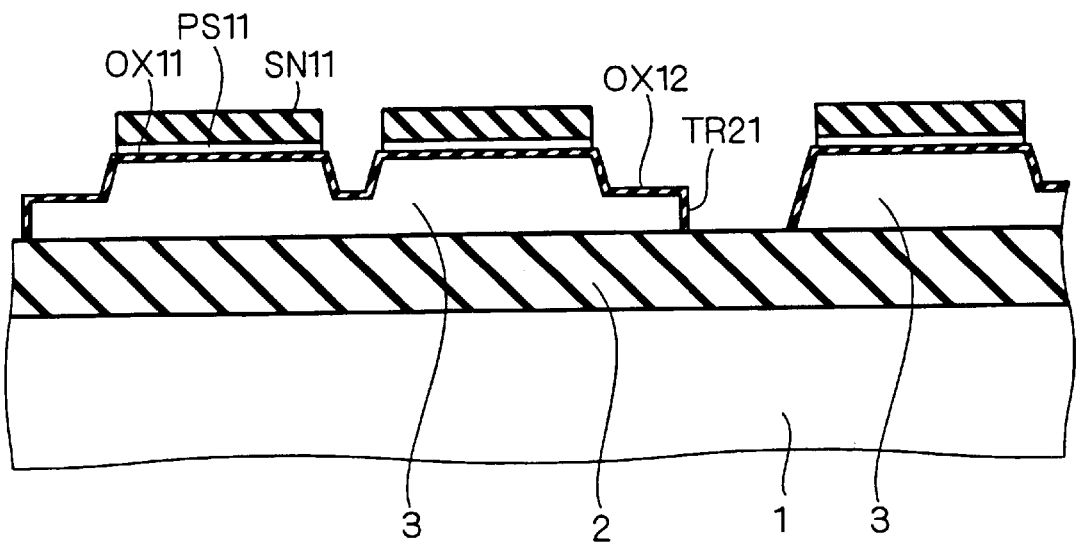

After the resist mask RM12 is removed, in the step shown in FIG. 31, the exposed surface of the SOI layer 3 is thermally oxidized with the nitride film SN11 as a mask, to thereby form an oxide film OX12. Subsequent re-etching of the trench TR2 forms a trench TR21, part of which passes through the SOI layer 3.

Forming the oxide film OX12 is for the purpose of avoiding damage caused by etching for the patterning of the SOI layer 3 and of obtaining gate oxide films that will improve reliability through the prevention of dielectric breakdown.

The oxide film OX12 is formed to a thickness of about 1 to 60 nm (10 to 600 Å) at a temperature of about 800 to 1350° C. Annealing may be performed at least either before or after oxidation in any of nitrogen, hydrogen, and argon atmosphere. As an annealing condition, the treatment time is about 30 minutes to two hours for a relatively low temperature of 600 to 900° C. and is about two seconds to one minute for a relatively high temperature of 900 to 1300° C.

The annealing before oxidation can improve crystallinity of the outermost surface of the SOI layer 3, whereas the annealing after oxidation can relax stresses applied onto the SOI layer 3 by heat treatment.

Figure 32:
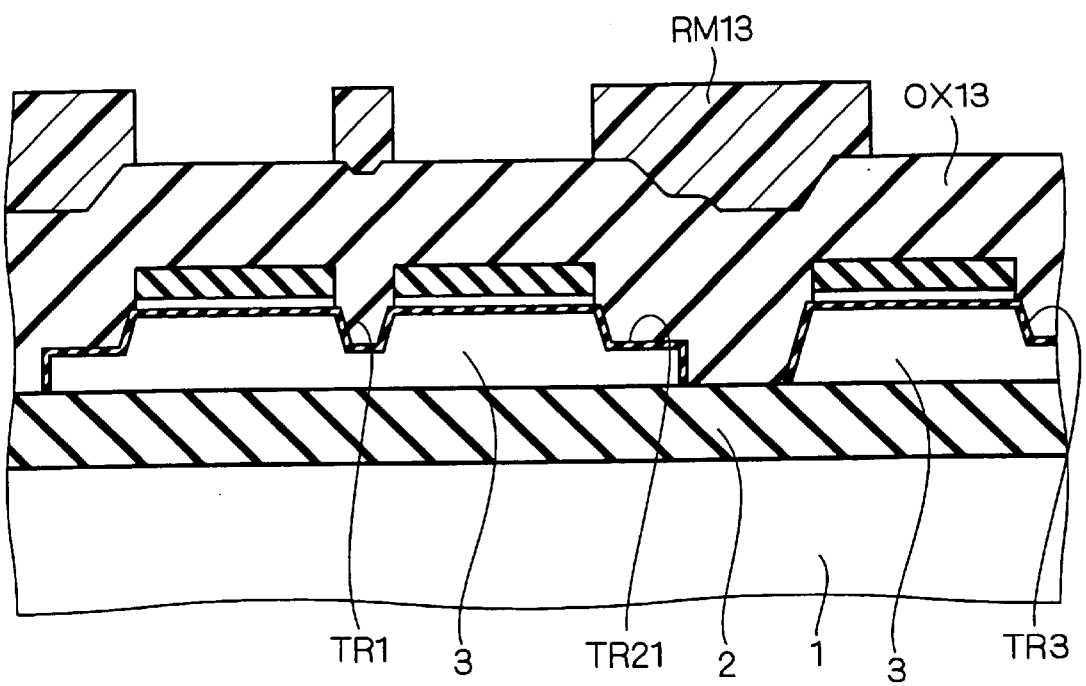
Figure 33:
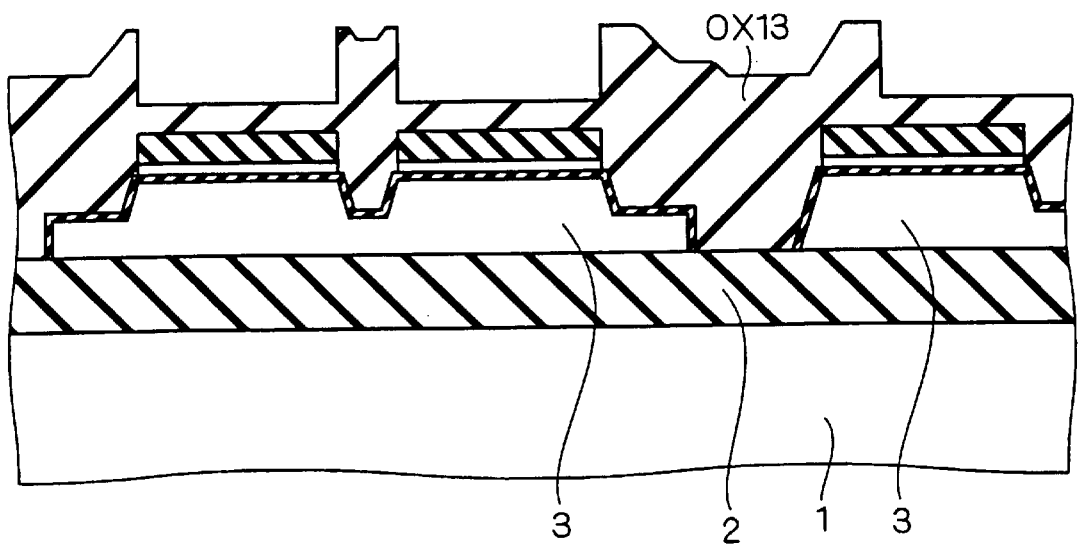

In the step shown in FIG. 32, an oxide film OX13 of about 300 to 600 nm in thickness is formed across the SOI substrate SB by CVD, to completely fill the trenches TR1, TR3 and TR21 with the oxide film OX13.

The oxide film OX13 is formed by HDP-CVD (high density plasma-CVD), for example. The HDP-CVD, which employs plasma with its density one or two digits higher than that in general plasma CVD, is to deposit an oxide film while performing sputtering and deposition simultaneously. This provides an oxide film of excellent film quality.

The oxide film OX13 has irregularities that reflect differences in level among the trenches TR1, TR3, TR21, and the like. To cover such irregularities, a patterned resist mask RM13 is formed on the oxide film OX13.

The oxide film OX13 is etched to a predetermined depth according to the opening pattern of the resist mask RM13 and thereafter the resist mask RM13 is removed. This provides the structure illustrated in FIG. 33. The reason for performing such processing is to improve uniformity in the thickness of the oxide film OX13 after planarization which will be performed in later CMP (chemical mechanical polishing) processing.

Figure 34:
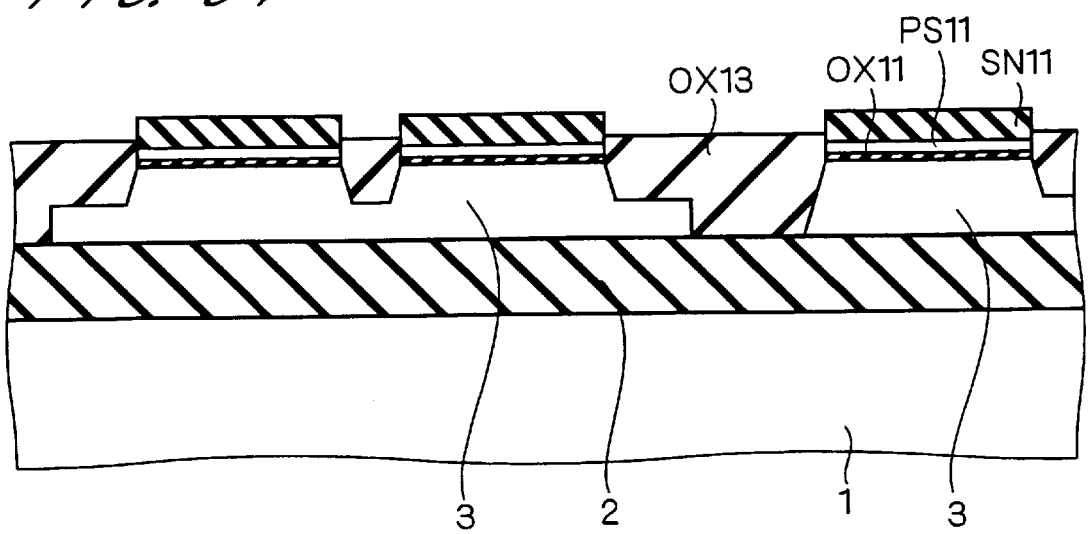

In the step shown in FIG. 34, the oxide film OX13 is polished to the middle of the nitride film SN11 by CMP for planarization. Then, the nitride film SN11 and the polysilicon layer PS11 are removed by wet or dry etching, to thereby form the partial isolation oxide films PT1 and PT2 and the combination isolation oxide film BT1 shown in FIG. 27.

Thereafter, NMOS transistors and PMOS transistors are formed in the NMOS transistor formation region NR and the PMOS transistor formation region PR, respectively, by existing methods. This completes the semiconductor device 500 shown in FIG. 27.

An example of the combination of a complete isolation oxide film and a partial isolation oxide film and its manufacturing method are disclosed for example in the specification of Japanese Patent Application No. 11-177091 (1999) along with the drawings, namely, FIGS. 4–7 and 8–27. The entire disclosure of the above Japanese Patent Application No. 11-177091 (U.S. patent application, Ser. No. 09/466,934 filed Dec. 20, 1999) is herein incorporated by reference.

Further, the structure of the combination isolation oxide film and its manufacturing method are disclosed in the specification of Japanese Patent Application No. 2000-39484 along with the drawings, namely, FIGS. 1–38. The entire disclosure of the above Japanese Patent Application No. 2000-39484 (U.S. patent application, Ser. No. 09/639,953 filed Aug. 17, 2000) is herein incorporated by reference.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   a first isolation oxide film provided in a main surface of said semiconductor substrate;
   an inductance element provided on a region in which said first isolation oxide film is formed with an interlayer insulation film therebetween; and
   a dummy pattern region provided around said first isolation oxide film and divided by a second isolation oxide film having a smaller width than said first isolation oxide film in a plan view.

2. The semiconductor device according to claim 1, wherein
   said first isolation oxide film is provided so that a horizontal distance between each end surface of said first isolation oxide film and a nearest one of end surfaces of said inductance element is not less than a vertical distance between a lower surface of said inductance element which is opposed to said first isolation oxide film, and a surface of said semiconductor substrate.

3. The semiconductor device according to claim 1, wherein:
   said semiconductor substrate is an SOI substrate comprising a substrate portion to be a foundation, a buried oxide film provided on said substrate portion, and an SOI layer provided on said buried oxide film; and
   said vertical distance is a vertical distance between the lower surface of said inductance element and a surface of said substrate portion.

4. The semiconductor device according to claim 3, wherein
   said first isolation oxide film includes a first portion having a first width and extending in a depth direction with respect to a surface of said buried oxide film, and a second portion having a second width smaller than said first width and being continuously formed under said first portion, extending in a depth direction with respect to said surface of said buried oxide film to reach said buried oxide film; and
   said end surface of said first isolation oxide film is an end surface of said second portion.

5. The semiconductor device according to claim 3, wherein
   said first isolation oxide film has a predetermined width and extends in a depth direction with respect to a surface of said buried oxide film.

6. The semiconductor device according to claim 1, wherein
   said first isolation oxide film is rectangular in shape in a plane view; and
   said dummy pattern region has a width 5% or more of a length of a short side of said first isolation oxide film.

7. The semiconductor device according to claim 6, wherein:
   said dummy pattern region includes a field portion defined by said second isolation oxide film; and
   an area ratio of said second isolation oxide film in said dummy pattern region to said field portion is set to be approximately 1:1.

* * * * *